United States Patent
Kurd et al.

(10) Patent No.: US 6,922,111 B2
(45) Date of Patent: Jul. 26, 2005

(54) ADAPTIVE FREQUENCY CLOCK SIGNAL

(75) Inventors: Nasser A. Kurd, Portland, OR (US); Javed S. Barkatullah, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 300 days.

(21) Appl. No.: 10/326,695

(22) Filed: Dec. 20, 2002

(65) Prior Publication Data

US 2004/0119521 A1 Jun. 24, 2004

(51) Int. Cl.⁷ .................................. G01N 27/00
(52) U.S. Cl. .............................. 331/48; 331/65
(58) Field of Search ................. 326/37, 38, 93–98; 331/48, 65, 66

(56) References Cited

U.S. PATENT DOCUMENTS

| | | | | |
|---|---|---|---|---|
| 4,045,791 A | * | 8/1977 | Fukai et al. | 345/101 |
| 4,896,337 A | * | 1/1990 | Bushy, Jr. | 375/371 |
| 5,815,694 A | * | 9/1998 | Ganfield et al. | 713/501 |
| 6,233,296 B1 | * | 5/2001 | Hofman | 375/375 |
| 6,487,668 B2 | * | 11/2002 | Thomas et al. | 713/322 |
| 6,608,528 B2 | * | 8/2003 | Tam et al. | 331/2 |
| 6,762,629 B2 | * | 7/2004 | Tam et al. | 327/114 |

* cited by examiner

*Primary Examiner*—Don Le
(74) *Attorney, Agent, or Firm*—Buckley, Maschoff & Talwalkar LLC

(57) ABSTRACT

According to some embodiments, a clock signal having an adaptive frequency is provided.

52 Claims, 26 Drawing Sheets

US 6,922,111 B2

ADAPTIVE FREQUENCY CLOCK SIGNAL

BACKGROUND

A clock signal may be distributed throughout a processor to facilitate the processor's operation. For example, state elements located at different points in the processor die may function synchronously by operating in accordance with the clock signal.

FIG. 1 is a block diagram of a traditional clock signal system 100. A core Phase-Locked Loop (PLL) unit 10 receives a reference clock signal and generates a clock signal (e.g., having a frequency of N* the frequency of the reference clock signal) that is provided to core state elements 30 via a core clock network 20 (e.g., a clock distribution tree). The output of the core clock network 20 is also provided back to the core PLL unit 10 through a divider 40 (e.g., a device that divides the feedback signal by N).

The reference clock signal is also provided to an Input Output (IO) PLL unit 110. The IO PLL unit 110 generates a clock signal (e.g., having a frequency of M* the frequency of the reference clock signal) that is provided to IO state elements 130 via an IO clock network 120. The output of the IO clock network 120 is also provided back to the IO PLL unit 110 through a divider 140 (e.g., a device that divides the feedback signal by M). The IO state elements 130 can then exchange information with the system and the core state elements 30. Note that the operation of the IO state elements 130 will be synchronized with the operation of the core state elements 30 (e.g., because each is receiving a clock signal that was generated based on the reference clock signal).

Several problems may arise, however, in the traditional clock signal system 100. For example, the core PLL unit 10 and the IO PLL unit 110 are powered by a fixed analog power supply such that once lock is achieved the core and IO clock frequencies will remain substantially fixed. When a large, sudden current requirement occurs, the on-die voltage provided to the core state elements 30 will "droop" (e.g., for a few nanoseconds) while the core PLL unit 10 continues to generate a clocks signal having a fixed frequency. Note that other voltage droop events may last even longer. To ensure that the processor functions during these droop events, a high voltage margin may be provided for the core state elments30 even during normal operation (e.g., when there is no voltage droop). That is, the processor is designed to operate at both the highest specified frequency and at the lowest potential voltage simultaneously.

Since power has a quadratic dependence on voltage, a significant amount of power may be wasted during normal operation to ensure functionality during the infrequent voltage droops. Moreover, as processor speed and integration increases, the amount of power that is required may become a limiting factor. For example, the costs of designing and cooling a processor that consumes a significant amount of power may become impractical.

DETAILED DESCRIPTION

Some of the embodiments described herein are associated with a "clock signal." As used herein, the phrase "clock signal" may refer to any signal that is used to synchronize the operation of state elements, such as elements in a processor, router, or any other integrated circuit (or chip set) having a clock signal. A clock signal may comprise, for example, a processor core's global clock signal.

Adaptive Frequency Clock Signal

Figure 1:
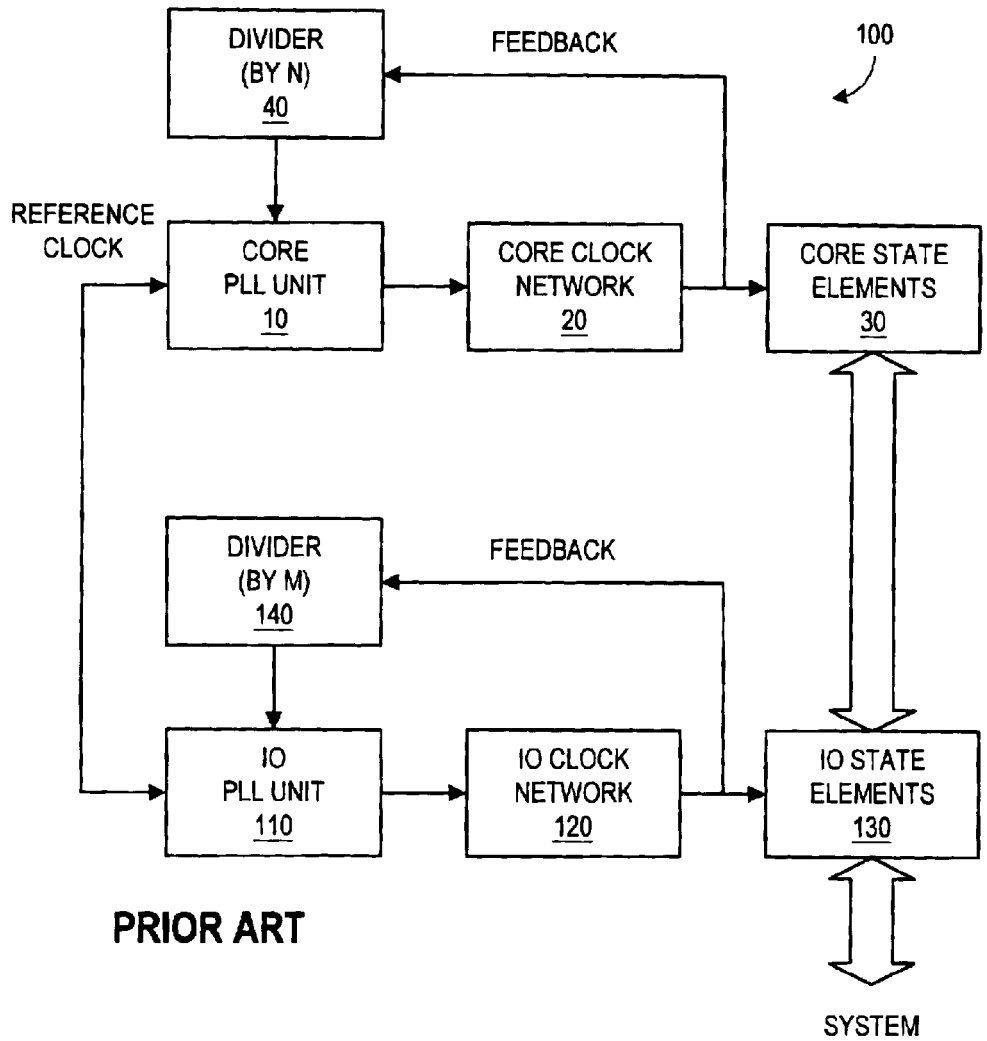
FIG. 1 is a block diagram of a traditional clock signal system.
Figure 2:
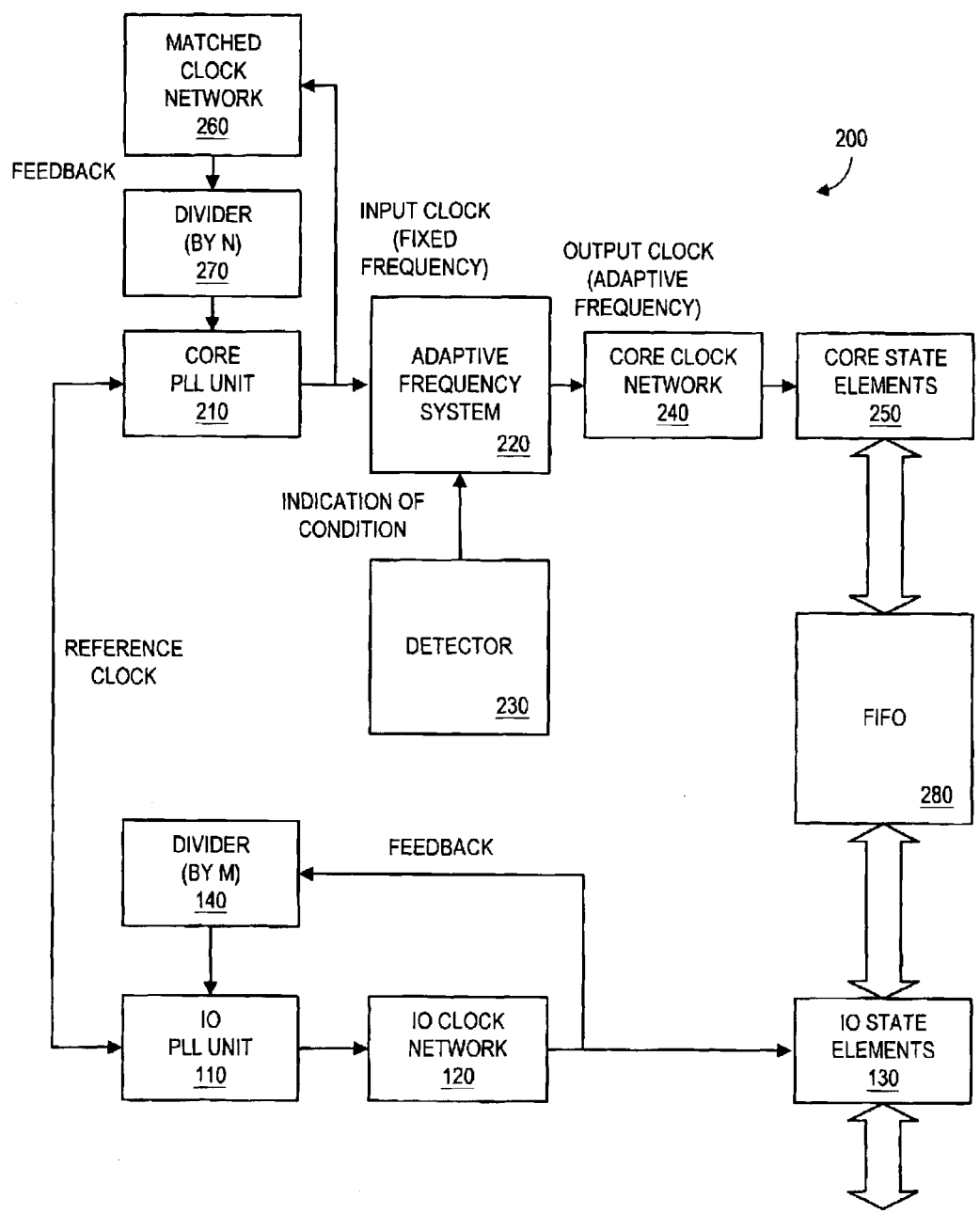
FIG. 2 is a block diagram of an adaptive frequency clock signal system according to some embodiments.

FIG. 2 is a block diagram of an adaptive frequency clock signal system 200 according to some embodiments. The system 200 may, for example, provide clock signals for a processor. A core PLL unit 210 receives a reference clock signal and generates a clock signal having a fixed frequency (e.g., having a frequency of N* the frequency of the reference clock signal). Note that the PLL unit 210 may receive power from an analog power supply (and thus continue to generate a fixed frequency clock signal even during a voltage droop).

The signal generated by the core PLL unit 210 is provided to an adaptive frequency system 220. Based on this input clock signal (e.g., received via a clock signal input line) and an indication of a condition associated with a die (e.g., the processor die) that is received from a detector 230, the adaptive frequency system 220 generates an output clock signal having an adaptive frequency (e.g., provided via a clock signal output line). For example, the detector 230 may generate an indication associated with a voltage droop. In this case, the adaptive frequency system 220 may generate an output clock having a default frequency when the indication is not present and an adjusted (e.g., lower) frequency when the indication is present. According to some embodiments, the detector 230 generates an indication in response to another condition, such as a thermal condition.

The output clock signal (with the adaptive frequency) is then provided to core state elements 250 via a core clock network 240.

The output of the core PLL unit 210 (with a fixed frequency) is also provided back to the core PLL unit 210 through a matched clock network 260 and a divider 270 (e.g., a device that divides the feedback signal by N). The matched clock network 260 may be designed, for example, to have delays similar to those present in the core clock network 240.

As in the traditional system, the reference clock signal is provided to an IO PLL unit 110. The IO PLL unit 110 generates a clock signal (e.g., having a frequency of M* the frequency of the reference clock signal) that is provided to IO state elements 130 via an IO clock network 120. The output of the IO clock network 120 is also provided back to the IO PLL unit 110 through a divider 140 (e.g., a device that divides the feedback signal by M). In this way, a fixed frequency clock signal is provided to the IO state elements 130 (e.g., so that the IO state elements 130 can communicate with the system in the normal fashion).

Note that the operation of the IO state elements 130 might not be synchronized with the operation of the core state elements 250 (e.g., because the core state elements 250 receive a clock signal having an adaptive frequency while the IO state elements 130 do not). As a result, a First-In, First-Out (FIFO) storage structure 280 may be used to facilitate an exchange of information between the IO state elements 130 and the core state elements 250. The FIFO storage structure 280 may comprise, for example a circular buffer with a read pointer and a write pointer. The depth and pointer separation of the FIFO storage structure 280 may be associated with the magnitude and duration of the adaptive clock frequency change during a voltage droop.

In this way, the core state elements 250 may not require a high voltage margin to ensure that the processor functions during voltage droops (e.g., because the frequency of the core clock signal is reduced as appropriate during the voltage droops).

Figure 3:
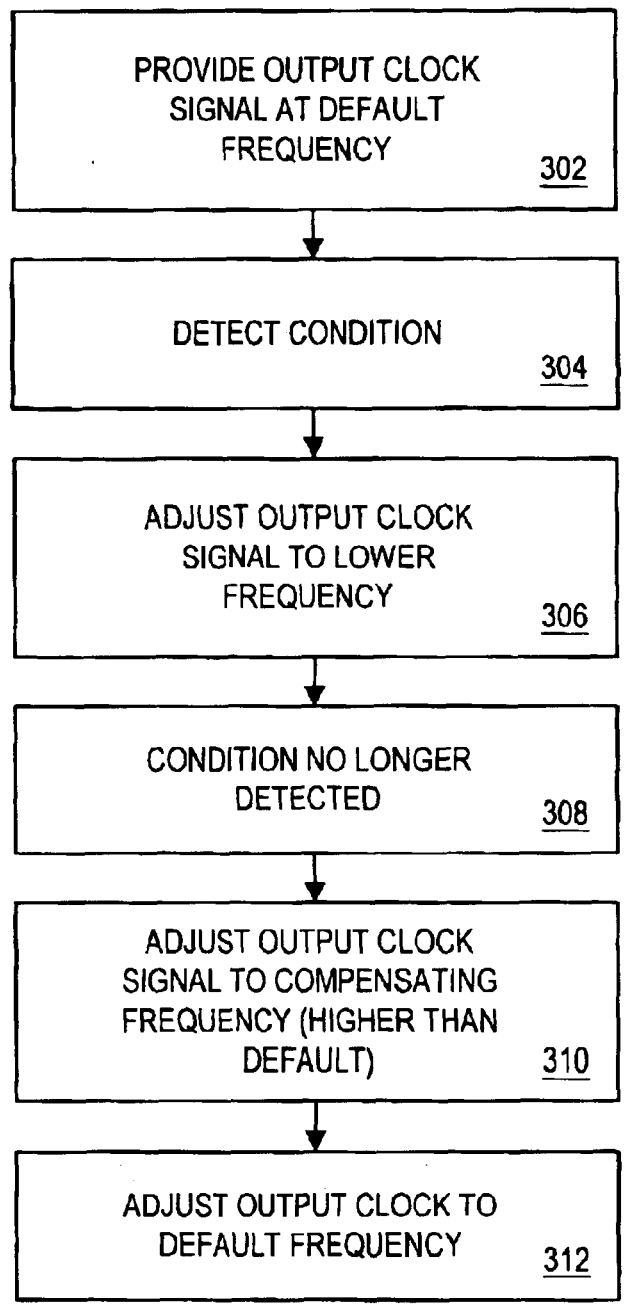
FIG. 3 is a flow chart of a method of facilitating distribution of an adaptive frequency clock signal according to some embodiments.

FIG. 3 is a flow chart of a method of facilitating distribution of an adaptive frequency clock signal according to some embodiments. The flow charts described herein do not imply a fixed order to the actions, and embodiments may be practiced in any order that is practicable. The method may be associated with, for example, the adaptive frequency system 220 illustrated in FIG. 2.

An output clock signal is provided at a default frequency at 302 until a condition is detected at 304. For example, a voltage droop detector or a thermal detector may detect a condition associated with a processor die.

In response to the detected condition, the output clock signal is adjusted to a lower frequency at 306. For example, the output clock signal may be adjusted to one of a plurality of discrete values or may instead be adjusted in an analog fashion.

Figure 4:
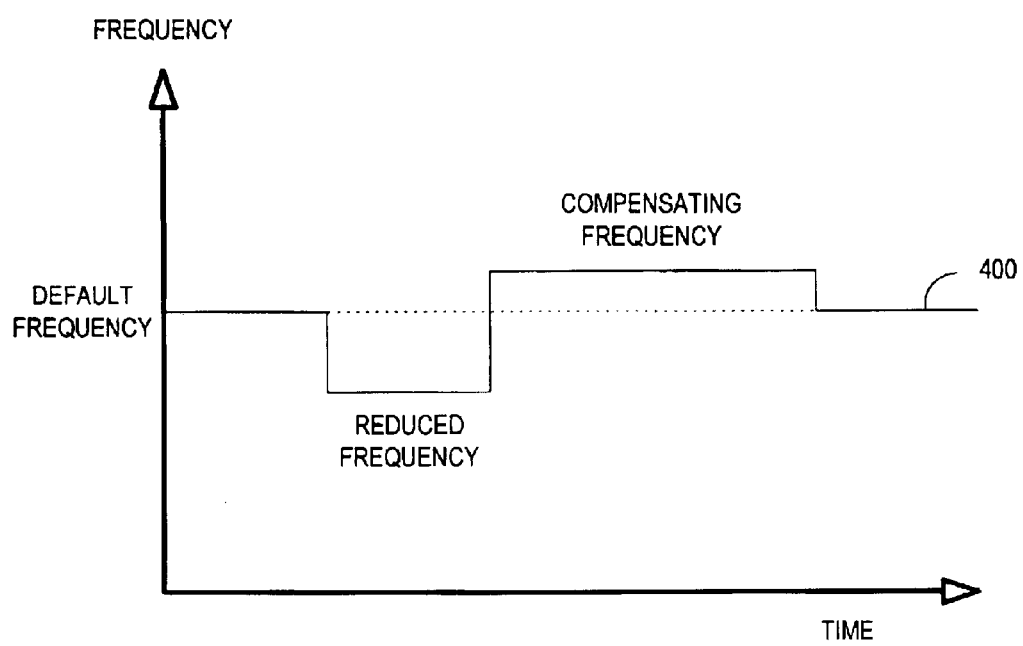
FIG. 4 is a graph associated with an adaptive frequency clock signal according to some embodiments.

At 308, the condition is no longer detected (e.g., the voltage droop is no longer present). As a result, the output clock signal is adjusted to a "compensating" frequency at 310. For example, FIG. 4 is a graph associated with an adaptive frequency clock signal 400 according to some embodiments. The compensating frequency may, for example, let the core state elements 250 (which were operating at a reduced frequency during the voltage droop) "catch up" with the IO state elements 130. Such an approach may enable deterministic operation and ensure that a fixed number of IO transactions may be performed within n bus clock cycles of a voltage droop. Note that difference between the compensating frequency and the default frequency might be equal in magnitude and duration as compared to the difference between the reduced frequency and the default frequency. According to another embodiment, the increase in frequency is less than the associated decrease (although longer in duration). Referring again to FIG. 3, the output clock is adjusted back to the default frequency at 312.

Clock Signal Stretching Circuit

Figure 5:
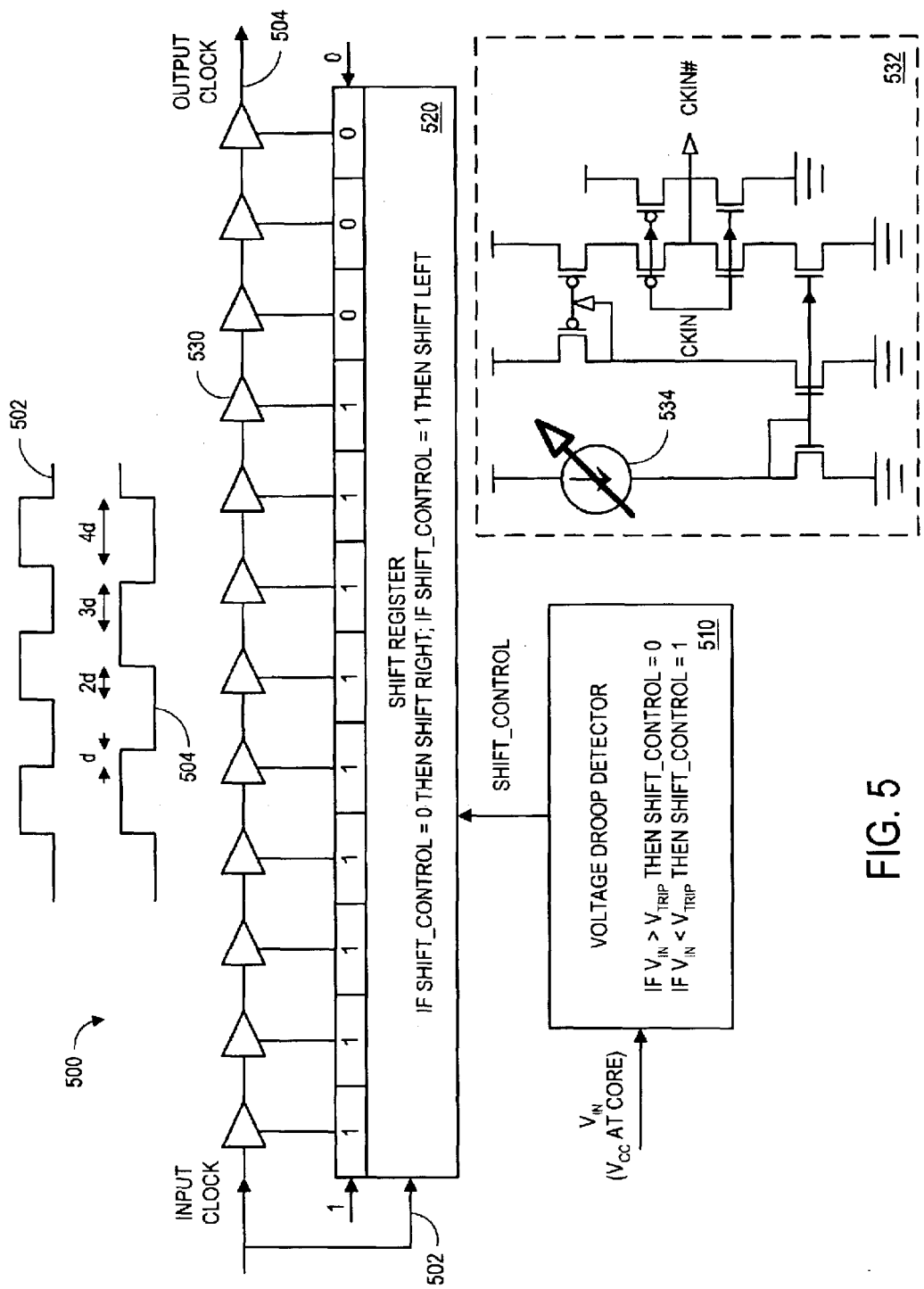
FIG. 5 is a block diagram of a clock signal stretching circuit according to some embodiments.

FIG. 5 is a block diagram of a clock signal stretching circuit 500 according to some embodiments. In particular, according to this embodiment a delay chain generates an output clock signal having an adaptive frequency.

A voltage droop detector 510 receives a $V_{IN}$ signal associated with $V_{CC}$ at the processor core. The voltage droop detector 510 generates a SHIFT_CONTROL signal that is provided to a shift register 520 as follows. The SHIFT_CONTROL signal will equal 0 when $V_{IN}$ is greater than a threshold voltage ($V_{TRIP}$) and 1 when $V_{IN}$ is less than $V_{TRIP}$. $V_{TRIP}$ may represent, for example, a voltage below which the frequency of the processor's core clock signal should be reduced.

The shift register 520 shifts on both rising and falling edge of the clock signal as follows. When the SHIFT_CONTROL signal equals 1, the shift register 520 shifts its contents right and fills the Most Significant Bit (MSB) with a 1. When the SHIFT_CONTROL signal equals 0, the shift register 520 shifts its contents left and fills the Least Significant Bit (LSB) with a 0. In this way, the number of 1's in the shift control register 520 will gradually increase while $V_{IN}$ is less than $V_{TRIP}$ and decrease while $V_{IN}$ is greater than $V_{TRIP}$.

Each bit in the shift control register 520 is provided to a bimodal delay element 530. One example of a bimodal delay element design 534 is illustrated in FIG. 5. Note that the bimodal delay element 530 may be meta-stable immune.

A 0 in the shift control register 520 causes the associated bimodal delay element 530 to operate in a fast mode, and a 1 causes the bimodal delay element 530 to operate in a slow mode. As a result, the series of bimodal delay elements 530 act as a delay chain that can stretch the input clock signal when $V_{IN}$ is less than $V_{TRIP}$.

For example, consider the input clock signal 502 and the output clock signal 504 illustrated in FIG. 5 (and assume that the difference between the delay in the slow mode and the fast mode for each bimodal delay element 530 is d). During the first rising edge of the input clock signal 502 $V_{IN}$ is (and has been) greater than $V_{TRIP}$. As a result, the first rising edge of the output clock signal 504 is not offset. $V_{IN}$ then falls below $V_{TRIP}$, causing a single 1 to be shifted into the shift register 520. Thus, one bimodal delay element will now operate in the slow mode and the first falling edge of the output clock signal 504 is offset from the first falling edge of the output clock signal 502 by d. If $V_{IN}$ remains below $V_{TRIP}$, another 1 will be shifted into the shift register 520 and the second rising edge of the output clock signal 504 is offset from the second rising edge of the output clock signal 502 by d.

Thus, the frequency of the output clock signal will be reduced (i.e., the period is increased by 2d) while $V_{IN}$ is less than $V_{TRIP}$ (at least until every bit in the shift register 520 is filled with a 1). In a similar way, when $V_{IN}$ is greater than $V_{TRIP}$ the frequency of the output clock signal is increased to match the input clock signal (and every bit in the shift register 520 will eventually be filled with a 0).

According to some embodiments, a clock signal stretching circuit can decrease the frequency of the input clock signal to any of a number of different frequencies (e.g., representing a 10% or 20% decrease in accordance with a voltage droop level). Moreover, the circuit may increase the frequency of an input clock signal above a default frequency by still another amount (e.g., to a compensating frequency as described with respect to FIG. 4). For example, a multi-input (e.g., a four-input) select 534 in the bimodal delay element design 532 illustrated in FIG. 5 may be used to establish one of a number of different delay modes. In this case, a number of shift registers 520 could be used to drive the multi-input select 534. Moreover, the operation of the shift registers 520 may be different during a voltage droop (e.g., a 1 might be shifted into each of the multi-input select 534 simultaneously to reduce the clock period for example by 2d where d is the difference in the slow and fast latency of the bimodal delay element when all its inputs are 1) as compared to immediately after the voltage droop (e.g., a 0 might be shifted into the multi-input select 534 one-by-one to create a less pronounced, but longer lasting, compensating frequency level).

Adaptive Frequency System Having a Delay-Locked Loop Unit

Figure 6:
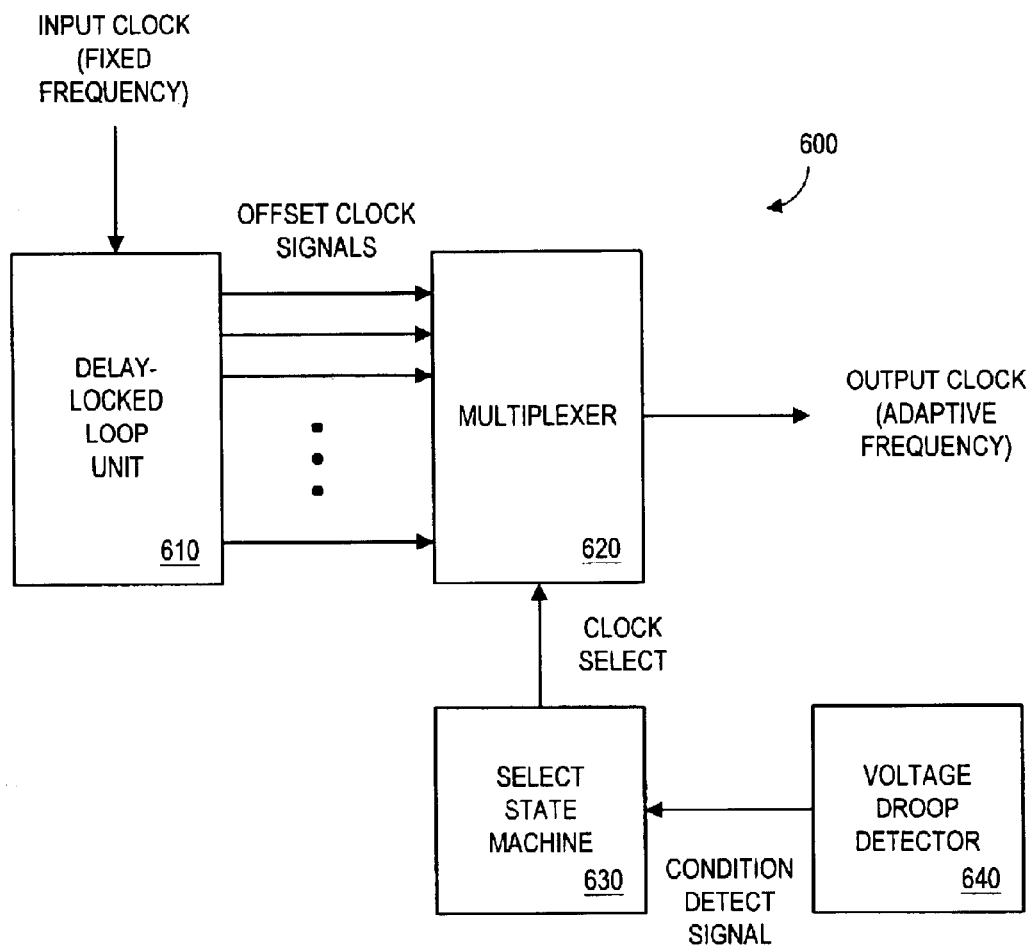
FIG. 6 is a block diagram of an adaptive frequency system having a delay-locked loop unit according to some embodiments.

FIG. 6 is a block diagram of an adaptive frequency system 600 according to some embodiments. In this case, a Delay-Locked Loop (DLL) unit 610 receives an input clock signal having a fixed frequency (e.g., from a PLL unit). The DLL unit 610 may, for example, be powered by a filtered power supply.

The DLL unit 610 is adapted to generate a plurality of offset clock signals and to provide those signals to a multiplexer 620. A select state machine 630 is coupled to the multiplexer 620 and is adapted to select one of the offset clock signals. In particular, the select state machine 630 selects offset clock signals in accordance with a condition detect signal received from a voltage droop detector 640. According to other embodiments, the select state machine 630 selects offset clock signals based on information received from another type of detector (e.g., a thermal detector).

Figure 7:
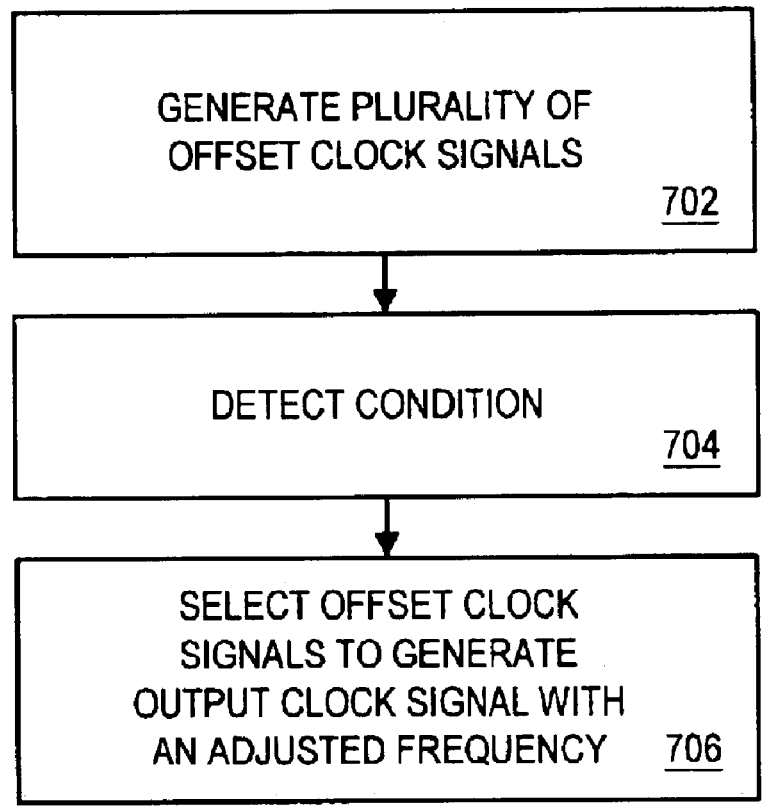
FIG. 7 is a flow chart of a method of providing an adaptive frequency clock signal according to some embodiments.

FIG. 7 is a flow chart of a method of providing an adaptive frequency clock signal according to some embodiments. At 702, a plurality of offset clock signals are generated (e.g., by the DLL unit 610). At 704, a condition is detected (e.g., by the voltage droop detector 640). At 706, offset clock signals are selected (e.g., by the select state machine 630) in order to generate an output clock signal having an adjusted frequency. That is, the offset clock signals are used to create an output clock signal having a frequency that is adapted as appropriate during a voltage droop.

Figure 8:
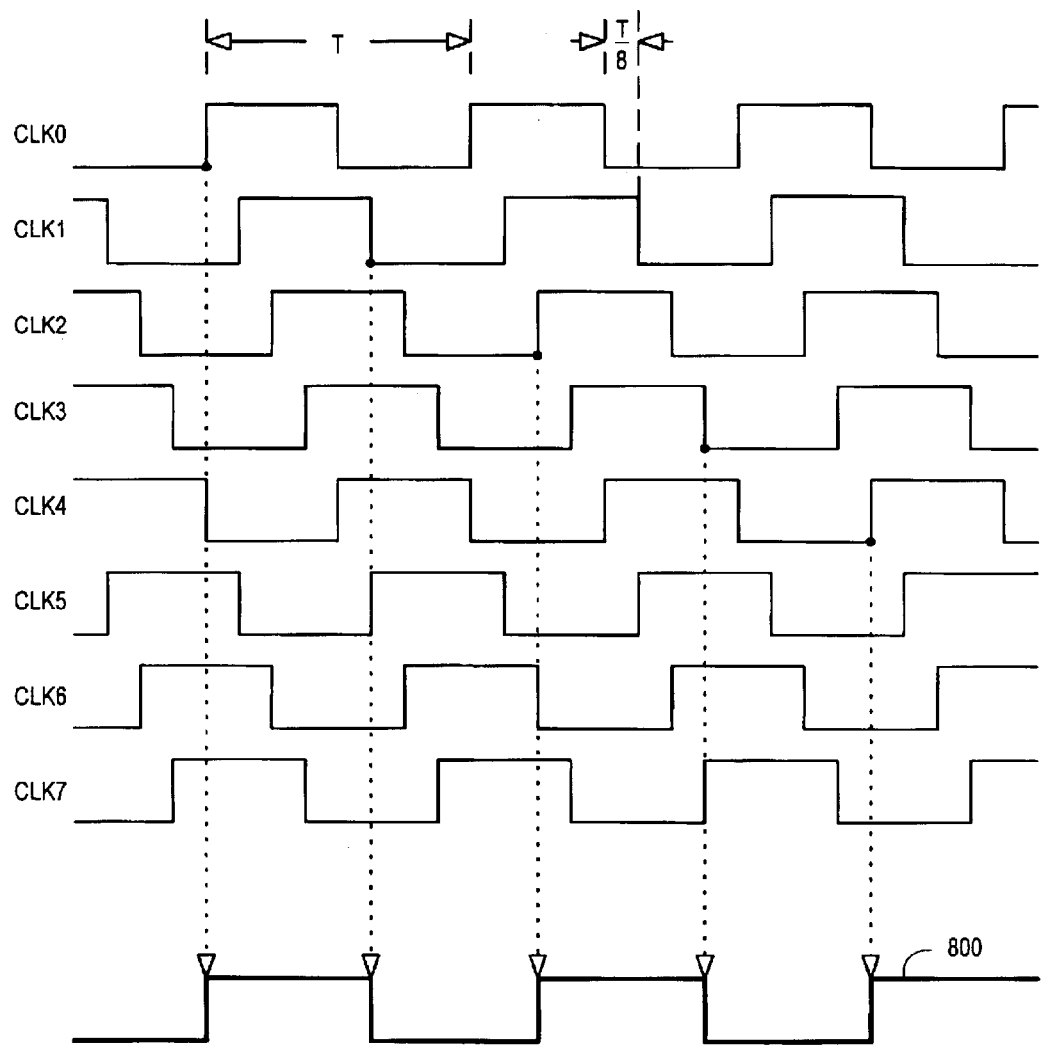
FIG. 8 illustrates the creation of an adaptive frequency clock signal according to some embodiments.

FIG. 8 illustrates the creation of an adaptive frequency clock signal 800 according to some embodiments. Although eight offset clock signals (CLK0 through CLK7) are illustrated in FIG. 8, any number of offset clock signals may be provided. Note that each clock signal has a period T and is offset from neighboring clock signals by T/8. The adaptive frequency clock signal 800 has a period of T+T/4 (and thus a lower frequency as compared to CLK0 through CLK7) and is created as follows. The first rising edge of CLK0 is used as the first rising edge of the signal 800, and the next falling edge of CLK1 is used as the next falling edge of the signal 800. Similarly, the next rising edge of CLK2 is used as the next rising edge of the signal 800, and the next falling edge of CLK3 is used as the next falling edge of the signal 800.

Thus, by selecting rising or falling edges from sequentially increasing offset clock signals (e.g., from the DLL unit 610), the select state machine 630 can create an output clock signal having a lower frequency (as compared to the offset clock signals) during a voltage droop. Note that the select state machine 630 could instead create an output clock signal having a higher frequency (as compared to the offset clock signals) by selecting rising or falling edges from sequentially decreasing offset clock signals (e.g., to create a compensating frequency as described with respect to FIG. 4). Moreover, consider again the clock signal stretching circuit 500 of FIG. 5. In that case, the circuit 500 could only lower the clock signal frequency for a limited period of time based on the size of the shift register 520 (and the associated number of bimodal delay elements 530). That is, when the shift register 520 is completely filled with Is the circuit 500 can no longer increase the number of delays to keep the clock signal at the reduced frequency. In contrast, the adaptive frequency system 600 illustrated in FIG. 6 may reduce the frequency of the clock signal indefinitely (although the size of a FIFO storage structure 280 might impose a limit).

Figure 9:
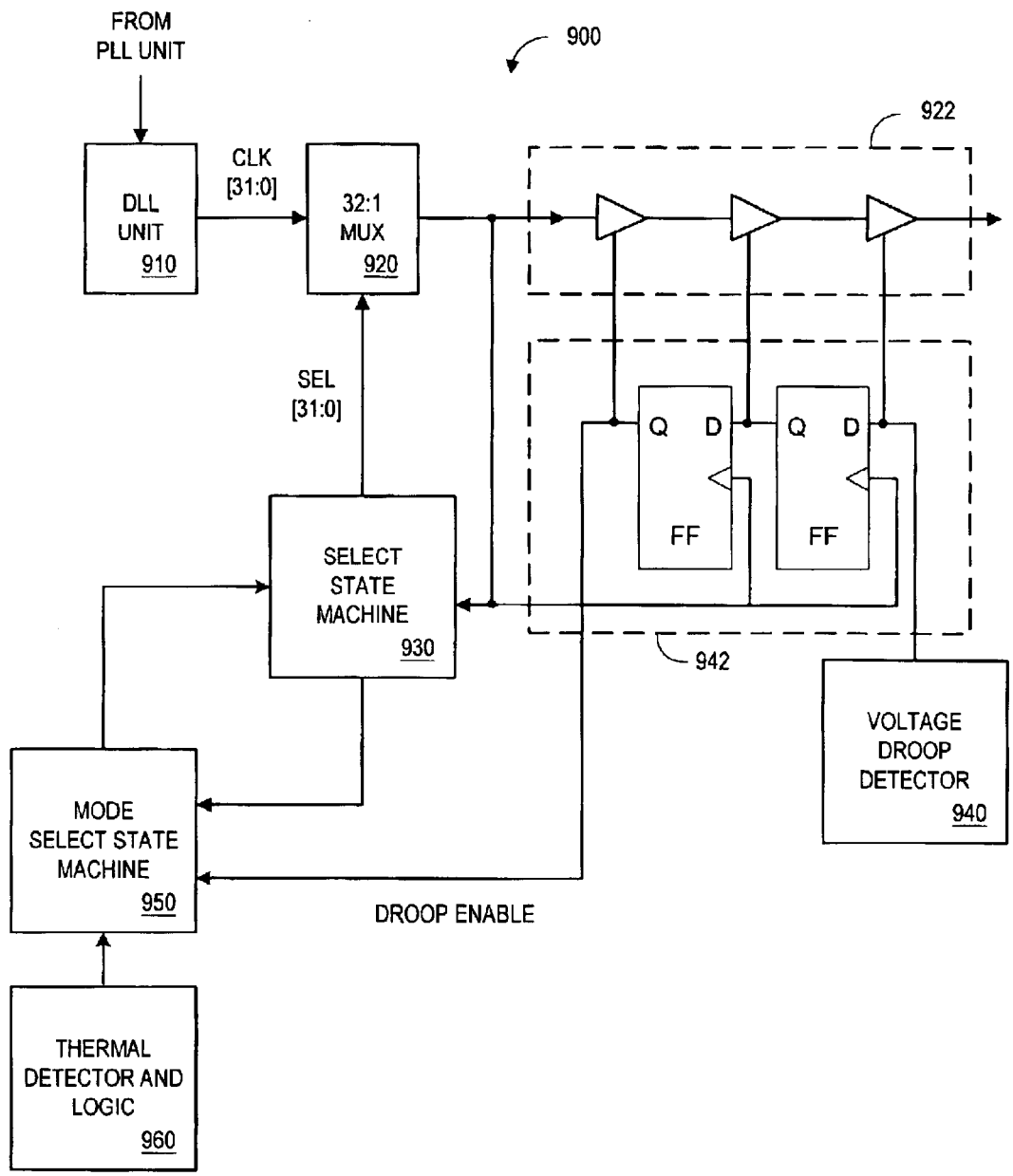
FIG. 9 is a block diagram of an adaptive frequency circuit with a mode select state machine and meta-stable interface according to some embodiments.

Adaptive Frequency System With a Mode Select State Machine and Meta-Stable Interface FIG. 9 is a block diagram of an adaptive frequency circuit 900 according to some embodiments. As before, a DLL unit 910 receives an input clock signal having a fixed frequency (and period T) from a PLL unit. The DLL unit 910 generates 32 offset clock signals, each offset by T/32, and provides the signals to a 32:1 multiplexer 920. A select state machine 930 is coupled to the multiplexer 920 and selects one of the 32 offset clock signals.

According to this embodiment, the select state machine 930 selects offset clock signals based on information generated by a voltage droop detector 940. In particular, a meta-stable immune interface 942 is provided between the voltage droop detector 940 and the select state machine 930. The interface 942 comprises two flip flops (e.g., master-slave flip flops) that generate a DROOP ENABLE signal based on information received from the voltage droop detector 940

After the DROOP ENABLE signal propagates through the interface 942, the select state machine 930 selects edges from the 32 offset clock signals to create a faster or slower output clock signal as appropriate. Note that a mode select state machine 950 is provided between the select state machine 930 and the interface 942. The mode select state machine 950 may, for example, determine an appropriate level of adjustment to the frequency of the output clock signal. Moreover, the mode select state machine 950 may track the number of slow clock cycles that were injected and provide an appropriate number of slightly faster, compensating clock cycles when the voltage droop is no longer present. The mode select state machine 950 may control the state machine 930 based on, for example, information received from the interface 942, the select state machine 930, and/or a thermal detector and associated logic 960 (e.g., another meta-stable immune interface).

Note that it may take several cycles for the voltage droop information to propagate through the interface 942. To adjust the frequency of the output clock signal during these cycles, a delay chain 922 is coupled between the multiplexer 920 and the clock signal output line. The delay chain 922 may comprise a meta-stable tolerable clock stretcher (e.g., a modulator) implemented with a cascading chain of bimodal delay elements. The operation of the delay chain 922 may be similar to, for example, the operation of the clock signal stretching circuit 500 described with respect to FIG. 5. That is, in each cycle one additional bimodal element may be switched from a fast mode to a slow mode in order to decrease the frequency of the output clock signal. Similarly, to increase the frequency of the output clock signal one less bimodal element may operate in a slow mode each cycle. According to this embodiment, the delay chain 922 is used to temporarily stretch the clock signal until the droop enable signal is synchronized (thus, the delay chain 922 may only need a small number of buffers). Note that the operation of the shift register 520 described in FIG. 5 has been replaced by the two flip flops in the meta-stable interface 942. If meta-stability occurs when the voltage droop detector 940 is enabled asynchronously, the effect of the delay chain 922 may only be to vary the amount by which that phase is stretched.

Figure 10:
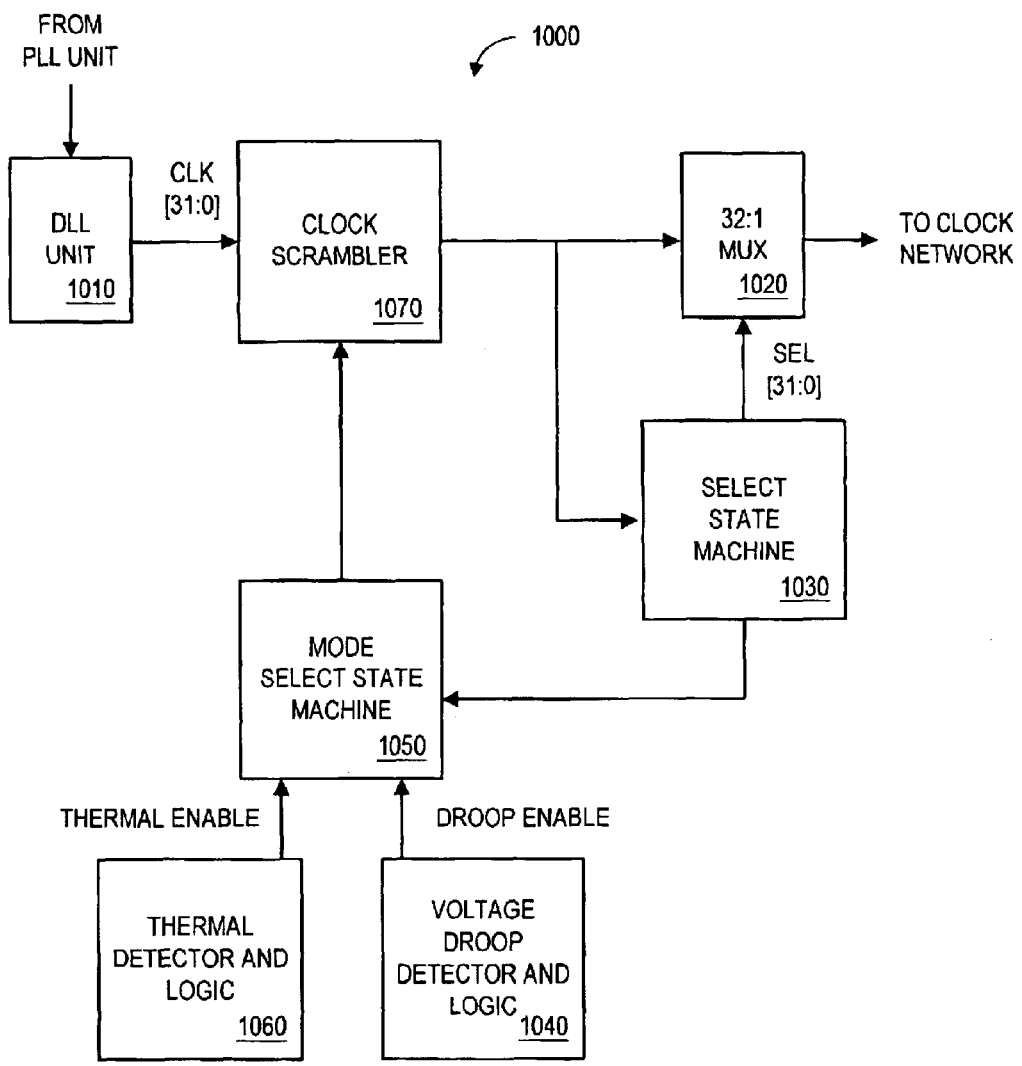
FIG. 10 is a block diagram of an adaptive frequency system having a clock scrambler according to some embodiments.

FIG. 10 is a block diagram of an adaptive frequency system 1000 having a clock scrambler 1070 according to some embodiments. The operation of the system 1000 may be similar to the operation of the system 900 described with respect to FIG. 9. That is, a DLL unit 1010 receives an input clock signal and generates 32 offset clock signals which are provided to a 32:1 multiplexer 1020. A select state machine 1030 is coupled to the multiplexer 1020 and selects one of the 32 offset clock signals.

According to this embodiment, however, a clock scrambler 1070 is provided between the DLL unit 1010 and the multiplexer 1020. The clock scrambler 1070 may receive information from a mode select state machine 1050. As before the mode select state machine 1050 may receive information from the select state machine 1030, a voltage droop detector with associated logic 1040, and a thermal detector with associated logic 1060. The clock scrambler 1070 scrambles the offset clock signals that are provided to the multiplexer 1020, which may enable functionality at higher frequencies (e.g., because a select timing critical path may be eliminated).

Consider again the circuit 900 illustrated in FIG. 9. In that case, the select state machine 930 may need to determine which of the 32 offset clock signals should be selected next. For example, to reduce the frequency of the input clock signal by a first amount the select state machine 930 might select offset clock signals in a sequential order (e.g., CLK0, CLK1, CLK2). To reduce the frequency by a second amount, the select state machine 930 might instead select offset clock signals in a different order (e.g., CLK0, CLK2, CLK4). The complexity required to determine the proper sequence may limit functionality of the circuit 900 at higher frequencies. In contrast, the select state machine 1030 illustrated in FIG. 10 can always select offset clock signals in a sequential order—because those signals have already been appropriately arranged by the clock scrambler 1070. Thus, the clock scrambler 1070 allows for a less complex select state machine 1030 and enables functionality at higher frequencies.

Delay-Locked Loop Unit Architecture

Figure 11:
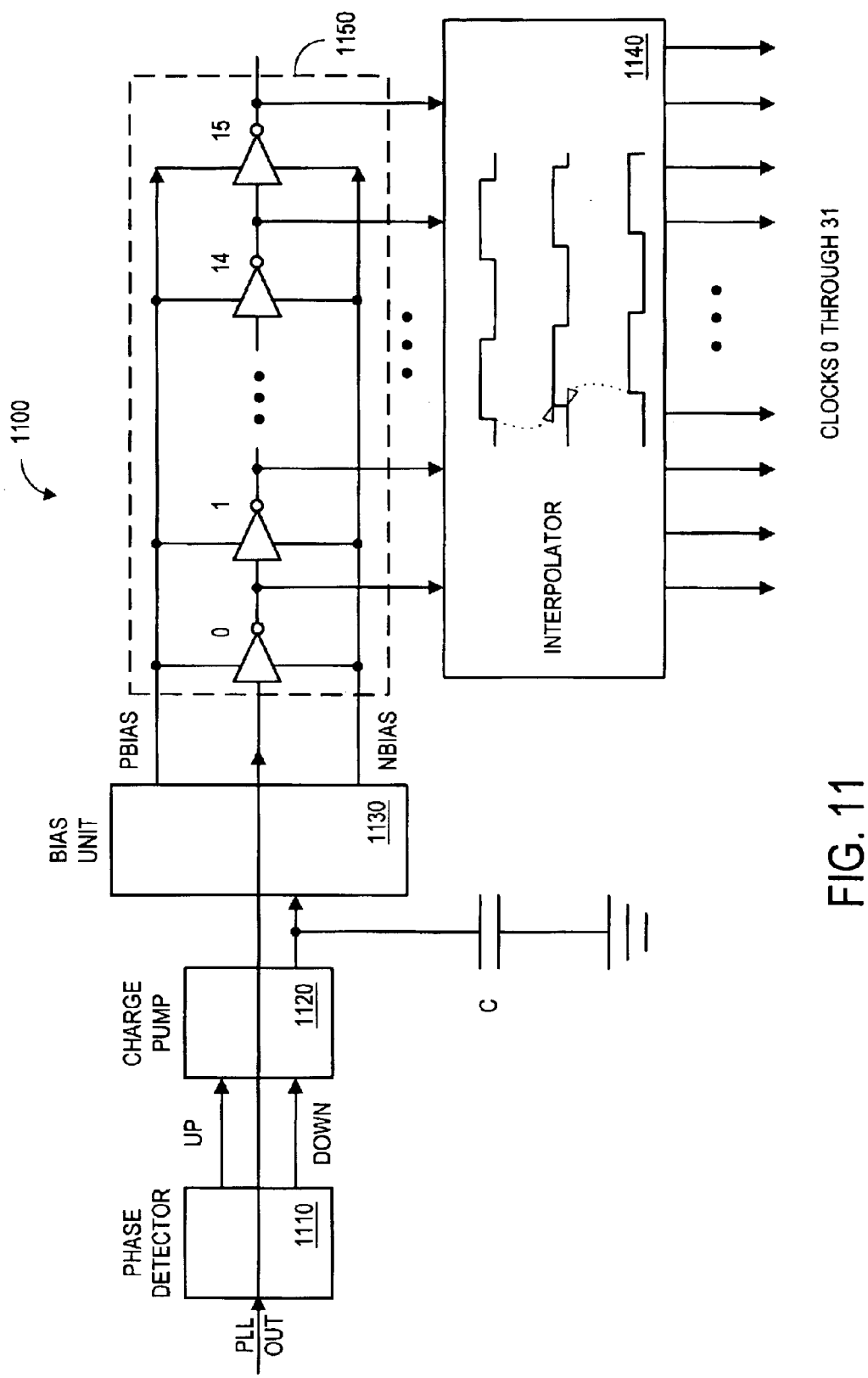
FIG. 11 is a diagram of a delay-locked loop unit architecture according to some embodiments.

FIG. 11 is a diagram of a DLL unit 1100 architecture according to some embodiments. The DLL unit 1100 may represent, for example, the DLL units 610, 910, 1010 described with respect to FIGS. 6, 9, and 10. In general, the DLL unit 1100 generates a first set of offset clock signals based on the input clock signal (e.g., received from the PLL unit via a clock signal input line) and an interpolator 1140 generates additional offset clock signals based on an interpolation of the first set of offset clock signals.

In particular, the PLL clock signal is fed to a phase detector 1110 and a voltage adjustable delay chain 1150. The phase detector 1110 compares the phases of the PLL clock signal and the output of the delay chain 1150. Based on this comparison, UP and DOWN signals are applied to a charge pump 1120 that in turn charges or discharges a capacitor C to produce a control voltage based on the lead/lag relationship of the phases. The control voltage is fed to a bias unit 1130 (e.g., a bias generator) that generates PBIAS and NBIAS signals, and each current starved delay element in the delay chain 1150 adjusts its delay based on these signals. According to this embodiment, lock is achieved when the delay through the delay chain 1150 is one cycle. According to other embodiments, however, lock may be achieved when the delay is multiple cycles.

The voltage controlled delay chain 1150 illustrated in FIG. 11 includes sixteen inverted delay stages and sixteen associated clock taps (one from each stage) that provide a first set of offset clock signals. Each clock signal is separated from its neighbors by T/16. This first set of clock signals are provided to an interpolator 1140 (e.g., having a clock re-mapping buffer) that generates thirty-two offset clock signals, each separated by T/32.

Figure 12:
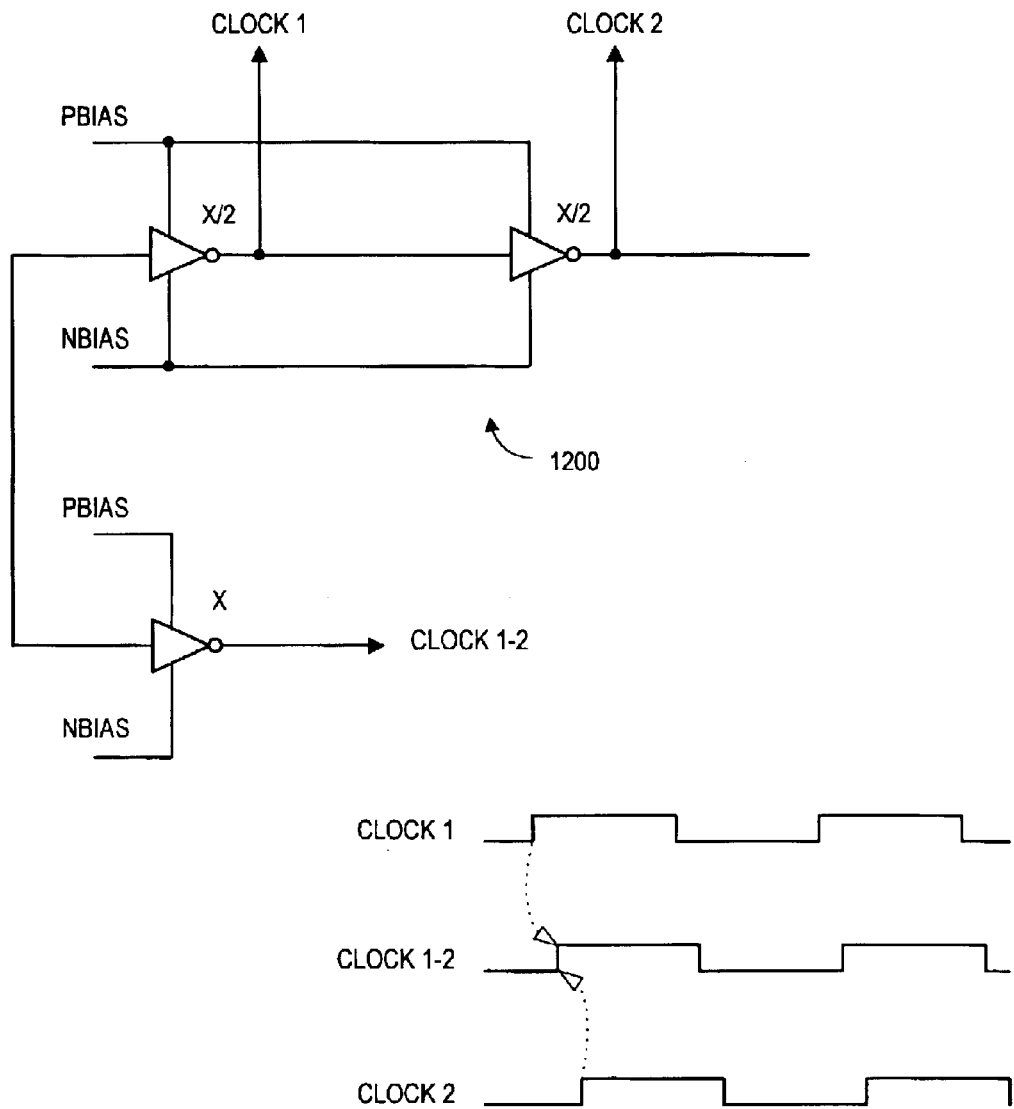
FIGS. 12 and 13 are diagrams of interpolator circuits according to some embodiments.
Figure 13:
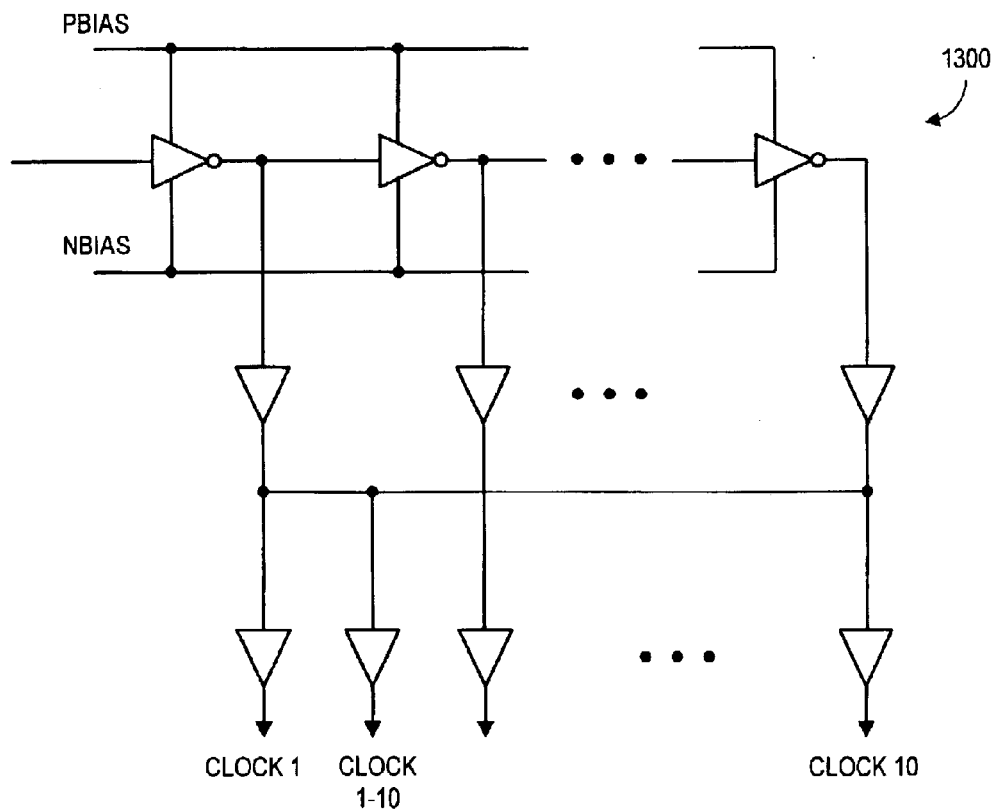
Figure 13:
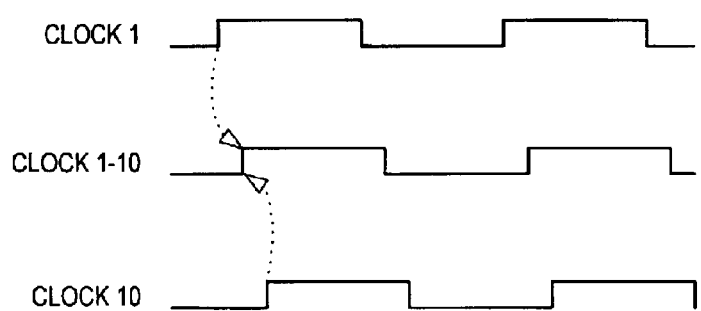

FIGS. 12 and 13 are diagrams of interpolator circuits according to some embodiments. In FIG. 12, the circuit 1200 interpolates CLOCK 1 and CLOCK 2 to create CLOCK 1-2 using device sizing. Note that additional loading may lower the maximum frequency range of the DLL unit 1100, but the circuit 1200 may be able to generate compensated clock signals regardless of any P and N transistor strength variations (compensated by the bias unit 1130). Careful buffing may reduce the effects of loading.

In FIG. 13, the circuit 1300 interpolates CLOCK 1 and CLOCK 10 to create CLOCK 1-10 using tap shorting (after buffering). This approach may not have the loading problems associated with FIG. 12, but the accuracy may be reduced due to variations in P and N transistor strength. According to some embodiments, such variations are reduced using programmable P and N transistors.

Select State Machine

Figure 14:
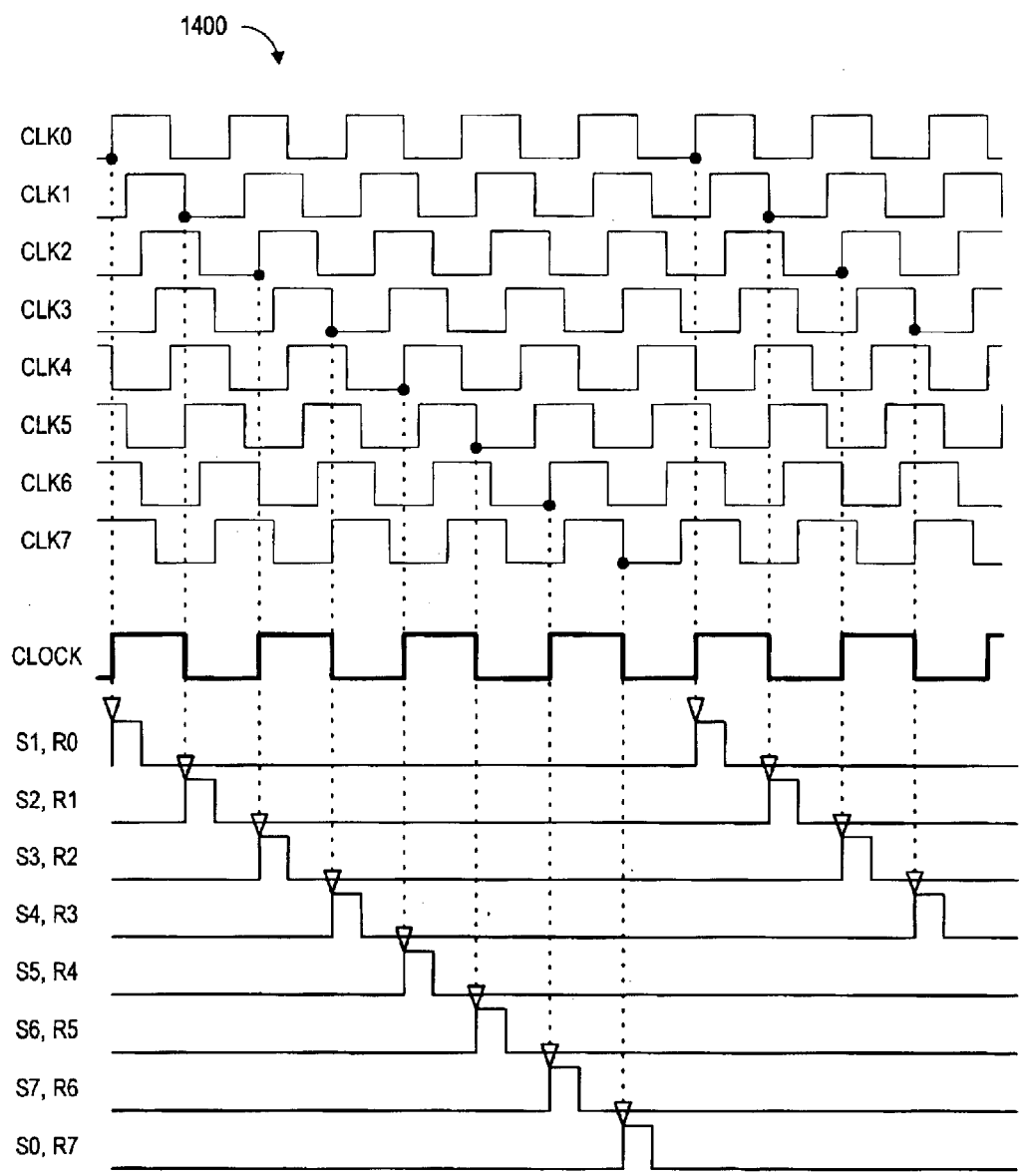
FIG. 14 illustrates select state machine signals according to some embodiments.

FIG. 14 illustrates select state machine signals 1400 according to some embodiments. In this embodiment, eight offset clock signals CLK0 through CLK7 are used to create a clock signal (CLOCK) having an adaptive frequency. That is, rising and falling edges from the offset clock signals may be selected by a select state machine (e.g., the select state machines 630, 930, 1030 described with respect to FIGS. 6, 9, and 10) as described with respect to FIG. 8.

The select state machine asserts one of eight selection signals (S0 through S7) to select the associated offset clock signal and one of eight reset signals (R0 through R7) to de-select the associated offset clock signal. For example, after the rising edge of CLK0 is used in CLOCK, the select state machine asserts R0 to de-select CLK0 and S1 to select CLK1 for the next edge. After the falling edge of CLK1 is used, the select state machine asserts R1 to de-select CLK1 and S2 to select CLK2 for the next edge. Note that after CLK7 is used, the select state machine asserts R7 to de-select CLK7 and S0 to again select CLK0 for the next edge.

To decrease the frequency of CLOCK (e.g., during a voltage droop), the offset clock signals are selected in the forward order (CLK0 to CLK7). To increase the frequency of CLOCK (e.g., to create a compensating frequency), the offset clock signals are selected in reverse order (CLK7 to CLK).

Figure 15:
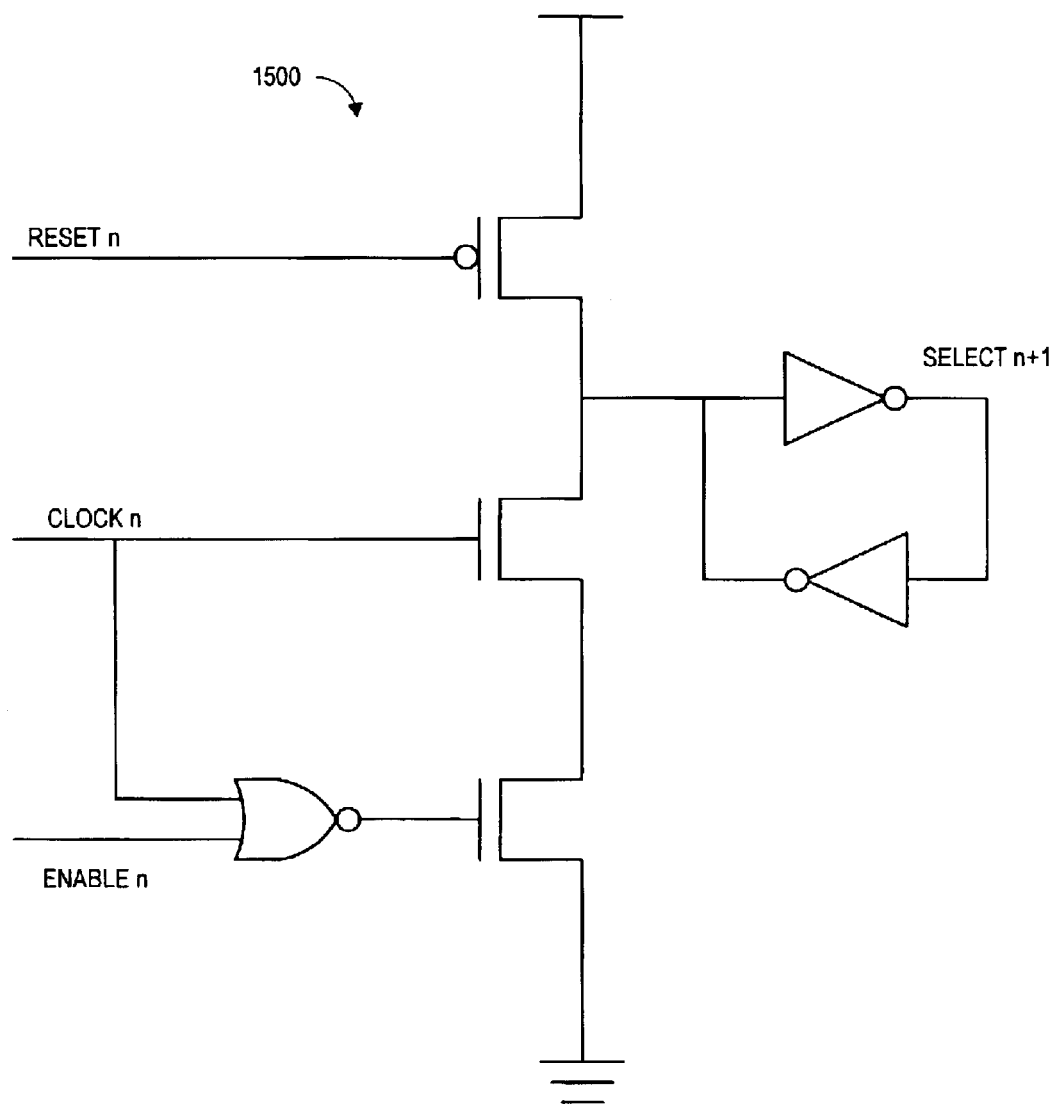
FIG. 15 illustrates a select state machine latching element according to some embodiments.

Note that the select state machine may need to operate at twice the clock speed, and, as a result, fast latching elements may be required. FIG. 15 illustrates an appropriate select state machine latching element 1500 according to some embodiments. The element 1500 may, for example, be associated with offset clock signals, reset signals, enable signals, and/or selection signals associated with the select state machines 630, 930, 1030 described with respect to FIGS. 6, 9, and 10.

Mode Select State Machine

Figure 16:
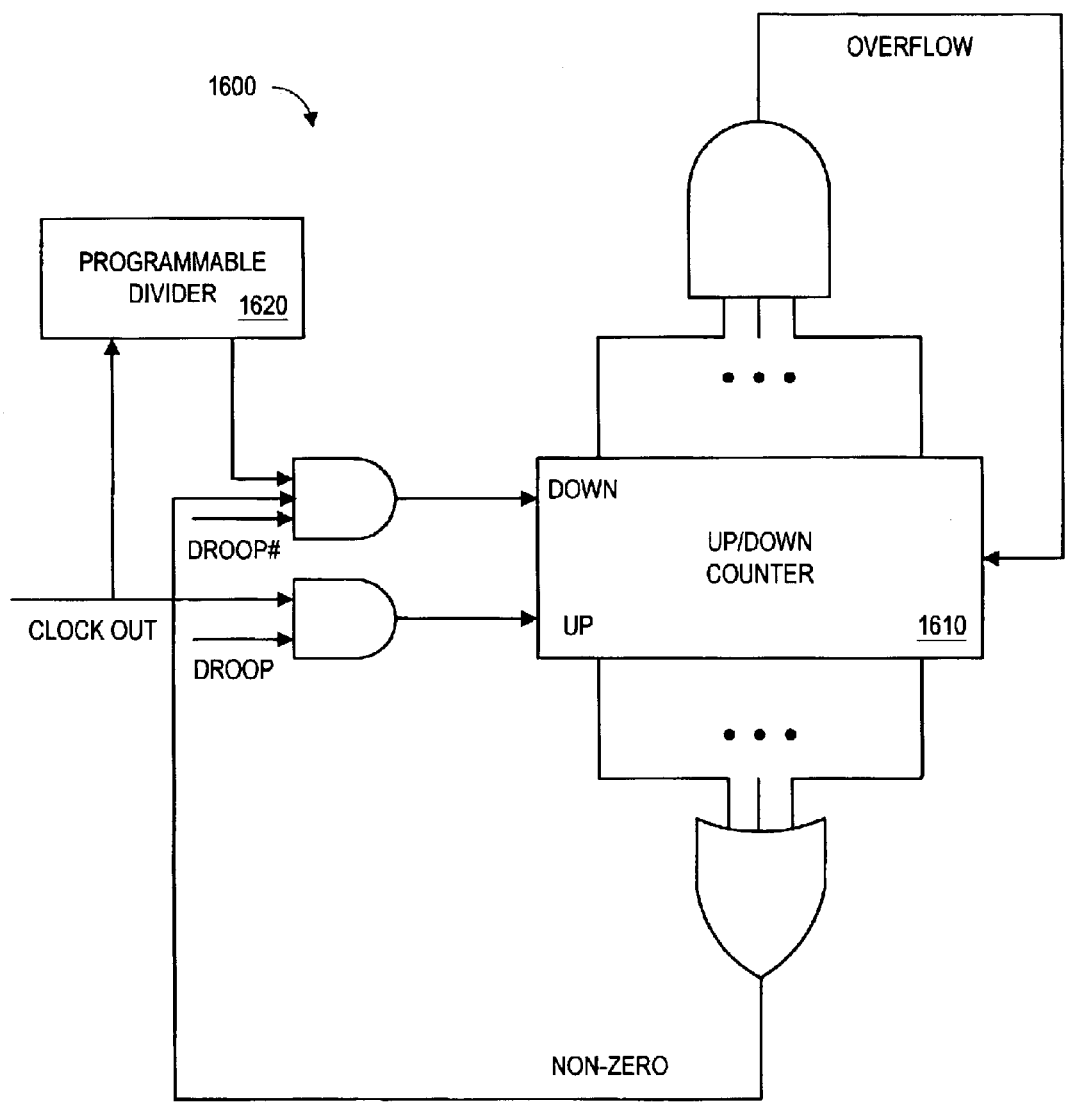
FIG. 16 illustrates a mode select state machine circuit according to some embodiments.

FIG. 16 illustrates a mode select state machine circuit 1600 according to some embodiments. The circuit 1600 may be associated with, for example, the mode select state machines 950, 1050 described with respect to FIGS. 9 and 10.

When the droop enable signal (DROOP) is asserted, the frequency of the clock signal is reduced (e.g., slower clocks are being injected). To track this condition, the circuit includes an up/down counter 1610 that counts up while DROOP is asserted. If the DROOP is asserted for a period of time that is short enough to be counted by the up/down counter 1610 without overflowing (e.g., if the voltage droops last only a few nanoseconds), the circuit 1600 may arrange for an appropriate number of faster clocks to be injected when the DROOP signal is de-asserted. That is, the information in the up/down counter 1610 may be used to determine how many faster, compensating clocks should be injected (e.g., so that a FIFO storage structure between core and IO state elements will not become full). Such an approach may allow deterministic testing so that the total number of edges within n bus clock cycles remains fixed.

A programmable divider 1620 may be programmable to support various fast/slow clock frequency ratios. As an example, if ten 25% slower clocks are injected in response to a voltage droop, the programmable divider 1620 may be set to four so that when the voltage droop is no longer present forty 6.25% faster clocks will be injected.

When the voltage droop lasts longer then can be tracked by the up/down counter 1610 (e.g., an overflow occurs when the counter reaches all 1s), slower clocks may still be injected until the voltage droop is no longer present. In this case, however, a signal might be sent to a bus unit in accordance with a core/IO interface protocol (e.g., because an appropriate number of faster clocks cannot be determined).

Storage Structure Between Core Portion and IO Portion

Figure 17:
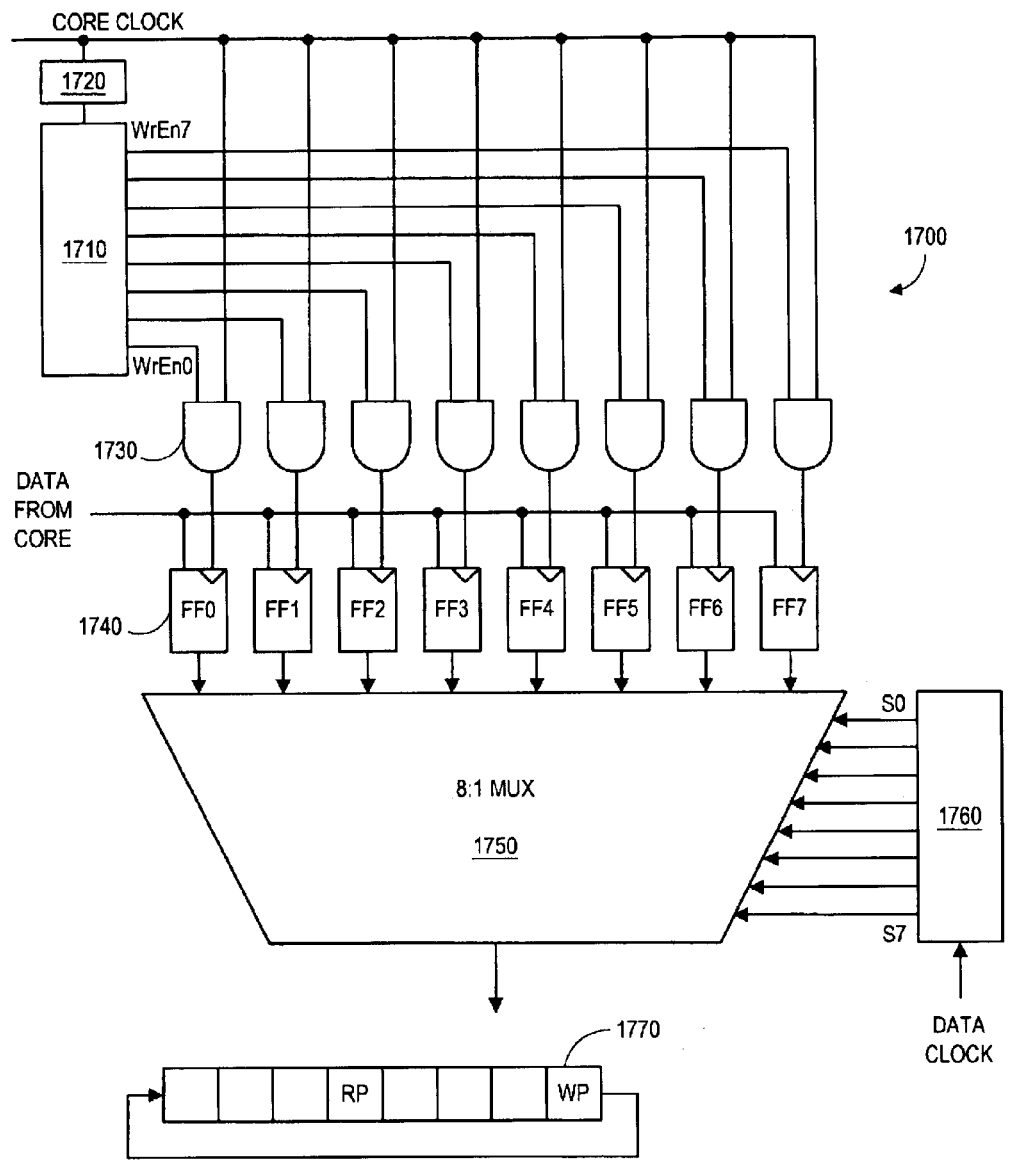
FIG. 17 is a block diagram of a first-in, first-out storage structure according to some embodiments.

FIG. 17 is a block diagram of a FIFO storage structure 1700 according to some embodiments. The structure 1700 may be associated with, for example, the FIFO storage structure 280 described with respect to FIG. 2 and may facilitate an exchange of information between a core portion of a processor (i.e., having a clock signal with an adaptive frequency) and an IO portion of the processor (i.e., having a clock signal with a fixed frequency) to enable deterministic results.

A counter and decoder 1710 is clocked by the core clock signal after it is divided by a factor of n via a divider 1720. The counter and decoder 1710 outputs eight write enable signals (WrEn0 through WrEn7) which are each input to an AND gate 1730 along with the core clock signal. The result of each AND operation is provided to an associated flip flop 1740 (e.g., a master-slave flip flop) that also receives data from the processor core (e.g., via din). The output from each of the eight flip flops (e.g., via dout) is input to an 8:1 multiplexer 1750 that is controlled by eight signals (S0 through S7) generated by another counter and decoder 1760 (which is clocked with the IO clock signal). As a result, a circular buffer 1770 may be implemented. Moreover, a distance between a read pointer (RP) and a write pointer (WP) may be selected so as to prevent any overlap between the two pointers.

Condition Levels and Associated Adaptive Frequencies

Figure 18:
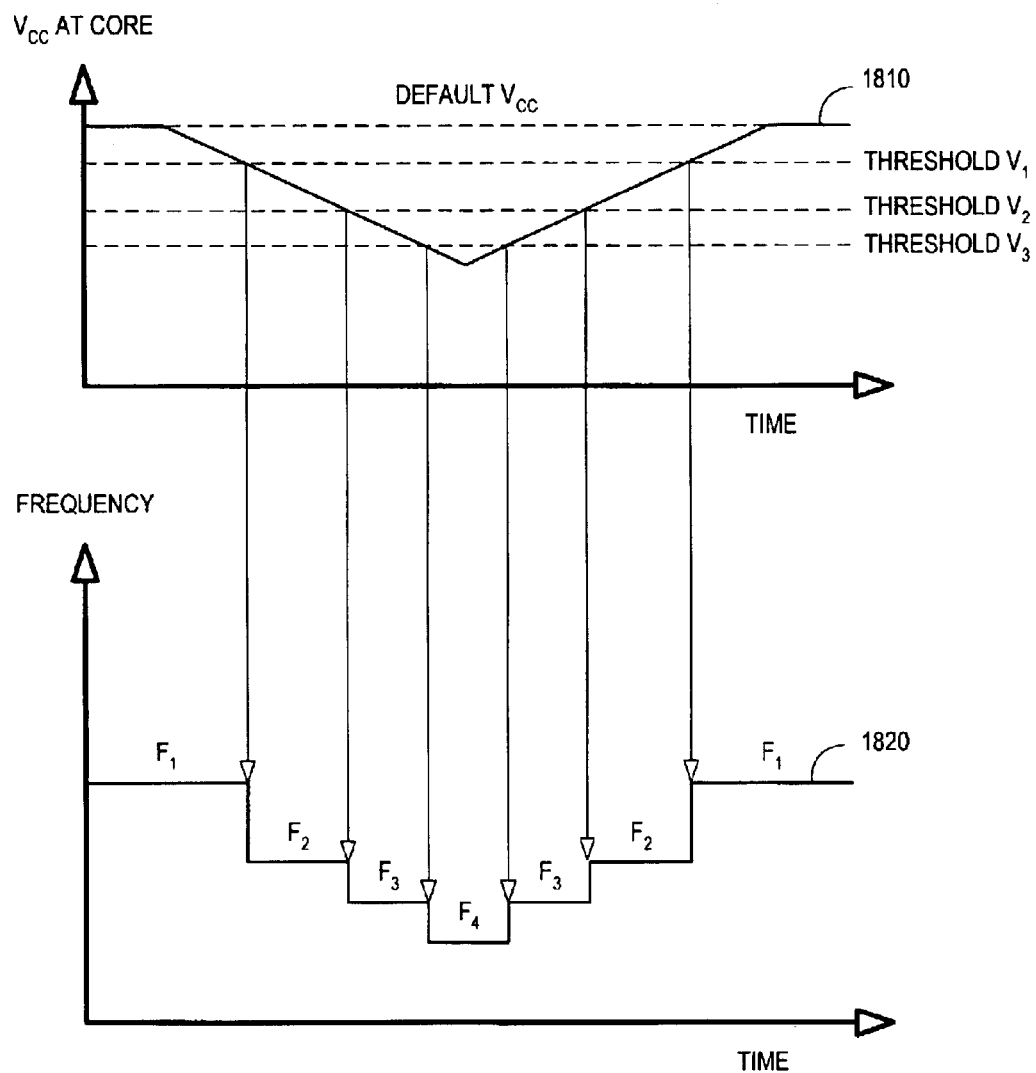
FIG. 18 illustrates core voltages and associated clock signal frequencies according to some embodiments.

FIG. 18 illustrates core voltages 1810 (e.g., $V_{CC}$) and associated clock signal frequencies 1820 according to some embodiments. In this case, a voltage droop detector may determine a level associated with a voltage droop in accordance with a number of different threshold values (thresholds $V_1$ through $V_3$).

When no voltage droop is detected (i.e., the voltage 1810 is at a default value or at least above threshold $V_1$), the frequency 1820 of the core clock signal is $F_1$. When a slight voltage droop is detected (i.e., the voltage 1810 is less than threshold $V_1$ but is still greater than threshold $V_2$), the frequency 1820 of the core clock signal is slowed to $F_2$. If a more severe voltage droop is detected (i.e., the voltage 1810 is less than threshold $V_2$ but is still greater than threshold $V_3$), the frequency 1820 is further slowed to $F_3$. Finally, the frequency 1820 is slowed to $F_4$ while the voltage 1810 remains below $V_3$.

Analog Adaptive Clock Frequencies

Figure 19:
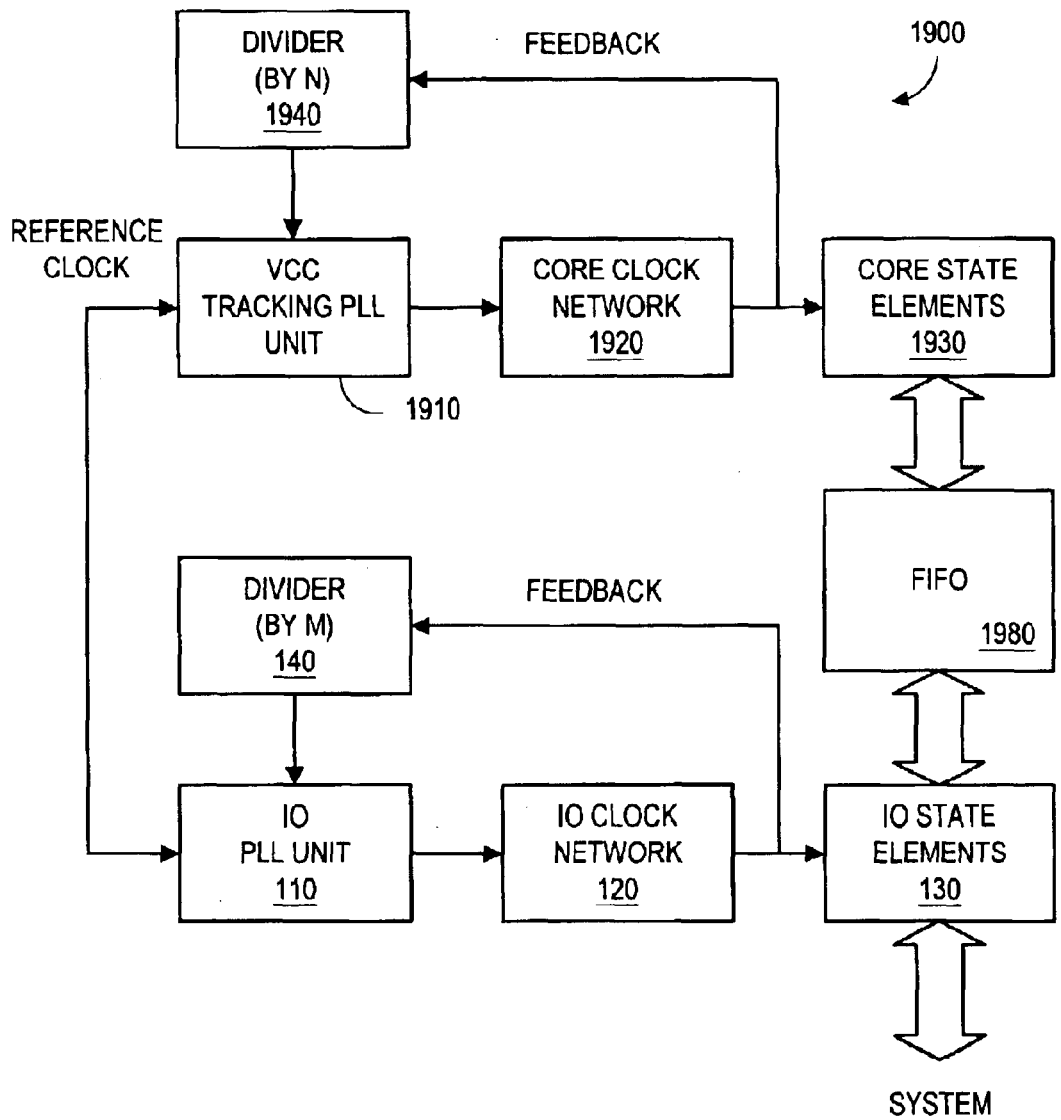
FIG. 19 is a block diagram of an analog adaptive clock generation and distribution circuit according to some embodiments.

According to some embodiments described herein, a clock signal frequency is adjusted to one of plurality of discrete frequencies (e.g., one of $F_1$ through $F_4$ as described with respect to FIG. 18). FIG. 19 is a block diagram of a clock generation and distribution circuit 1900 according to other embodiments wherein a clock signal frequency is instead adjusted in an analog fashion.

Figure 20:
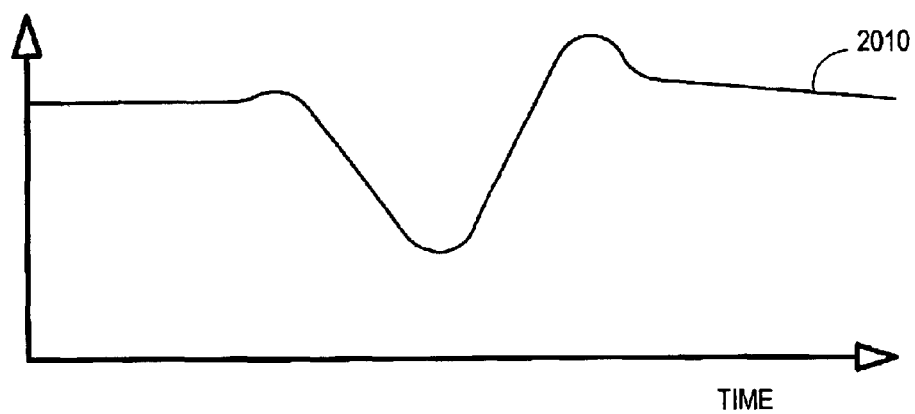
FIG. 20 illustrates core voltages and associated clock signal frequencies according to some embodiments.
Figure 20:
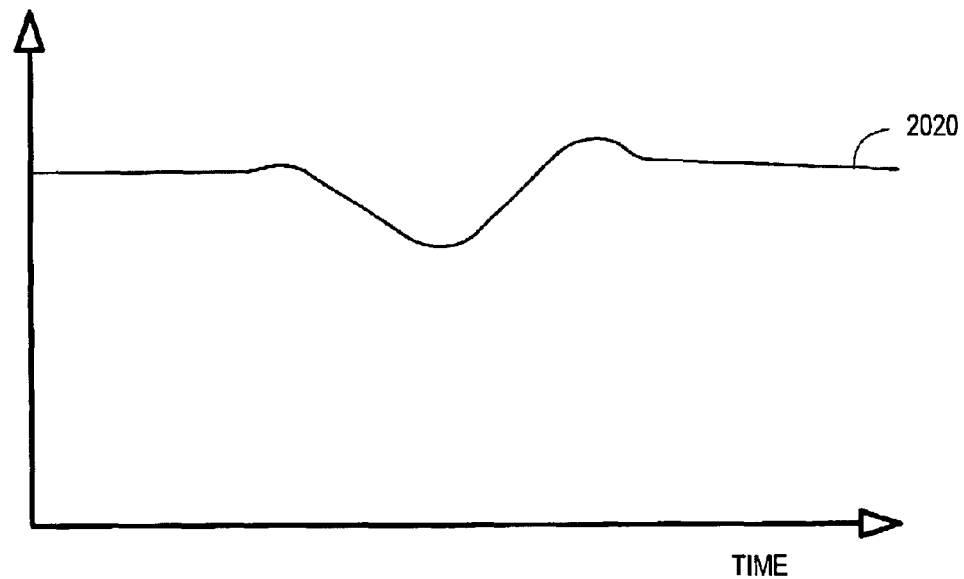

A $V_{CC}$ tracking PLL unit 1910 receives a reference clock signal and generates a clock signal having a frequency that is adjusted in an analog fashion (e.g., based on an amount of voltage droop being experienced by core state elements 1930). For example, FIG. 20 illustrates core voltages ($V_{CC}$) 2010 and associated clock signal frequencies 2020 according to some embodiments. As can be seen, the clock signal frequency 2020 "tracks" the core state element voltage in an analog fashion (i.e., the clock signal frequency smoothly decreases when the core state element voltage decreases and smoothly increases when the core state element voltage increases).

Referring again to FIG. 19, the clock signal is provided to the core state elements 1930 via a core clock network 1920 (e.g., a clock distribution tree). The output of the core clock network 1920 is also provided back to the $V_{CC}$ tracking PLL unit 1910 through a divider 1940.

The reference clock signal also provided to an IO PLL unit 110. The IO PLL unit 110 generates a clock signal that is provided to IO state elements 130 via an IO clock network

120. The output of the IO clock network 120 is also provided back to the IO PLL unit 110 through a divider 140. In this way, a fixed frequency clock signal may be provided to the IO state elements 130. As before, a FIFO storage structure 1980 may be used to facilitate an exchange of information between the IO state elements 130 and the core state elements 1930.

Figure 21:
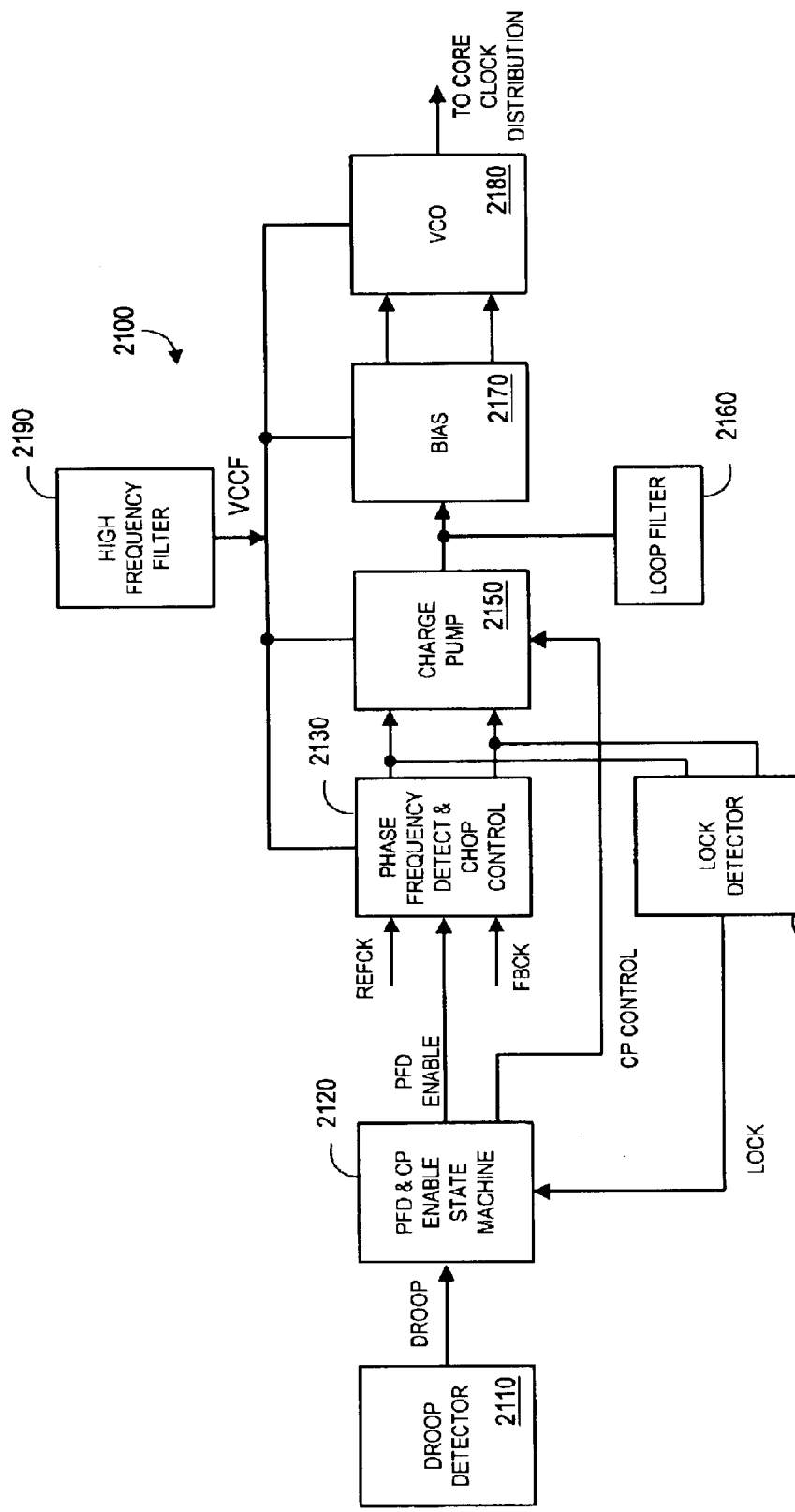
FIG. 21 is a block diagram of an analog adaptive frequency circuit according to some embodiments.

FIG. 21 is a block diagram of an analog adaptive frequency circuit 2100 according to some embodiments. The circuit 1900 may be associated with, for example, the $V_{CC}$ tracking PLL unit 1910 described with respect to FIG. 19. Note that the circuit 2100 may be powered from a digital on die power supply (e.g., as opposed to an analog power supply).

A droop detector 2110 provides a DROOP signal to a Phase Frequency Detect (PFD) and Charge Pump (CP) enable state machine 2120. Based on the DROOP signal and a LOCK signal from a lock detector 2140, a PFD ENABLE signal is provided to a PFD and chop control unit 2130 (e.g., with chop circuit, enable, and override) and a CP CONTROL signal is provided to an adjustable strength charge pump 2150.

The PFD and chop control unit 2130 also receives a reference clock signal (REFCK), a feedback clock signal (FBCK), and VCCF from a high frequency power supply filter 2190. The high frequency power supply filter 2190 may, for example, attenuate unwanted high frequency noises while passing low frequency information.

The PFD and chop control unit 2130 provides UPM and DNM signals to the charge pump 2150 and the lock detector 2140. The charge pump 2150 provides a signal to a bias unit 2170 and a loop filter 2160. The bias unit 2170 provides signals to a Voltage Controlled Oscillator (VCO) unit 2180 which outputs the adaptive frequency clock signal to the core clock distribution network.

According to some embodiments, the PFD and chop control unit 2130 helps ensure stability during a voltage droop event. For example, when a voltage droop occurs the circuit 2100 may slow down the frequency of the clock signal. As a result, phase error may accumulate until the next PFD sampling. If the phase error is large the circuit 2100 may attempt to speed up as a correction (e.g., resulting in unnecessary clock period shrinkage). In an extreme case, the circuit 2100 may lose lock because the phase error too large. By incorporating the chop circuit enabled only after lock, a safe limit may be set by which the circuit 2100 will remain stable (e.g., there may be no significant clock period change).

A control signal may reduce the strength of the charge pump 2150 and make the circuit 2100 over damped. If this signal is asserted significantly after lock, the configuration may retain reasonable lock and phase error. The charge pump 2150 strength control may also help reduce and filter out temporary jitter caused on the system and feedback clocks.

Note that the phase error accumulated during a voltage droop may not cause a significant core clock disturbance (e.g., timing might not be affected). Furthermore, the droop detector 2110 may disable PFD sampling during the voltage droop. This allows the phase error to stabilize, and the circuit 2100 may correct only the residual phase error (slowly and after the voltage droop ends). According to some embodiments, any transient phase error is ignored. Also, if the voltage undershoot is followed by a voltage overshoot, phase error cancellation may occur (enhancing the stability of the system). Also note that longer lasting voltage droops may cause the PFD to remain disabled.

Figure 22:
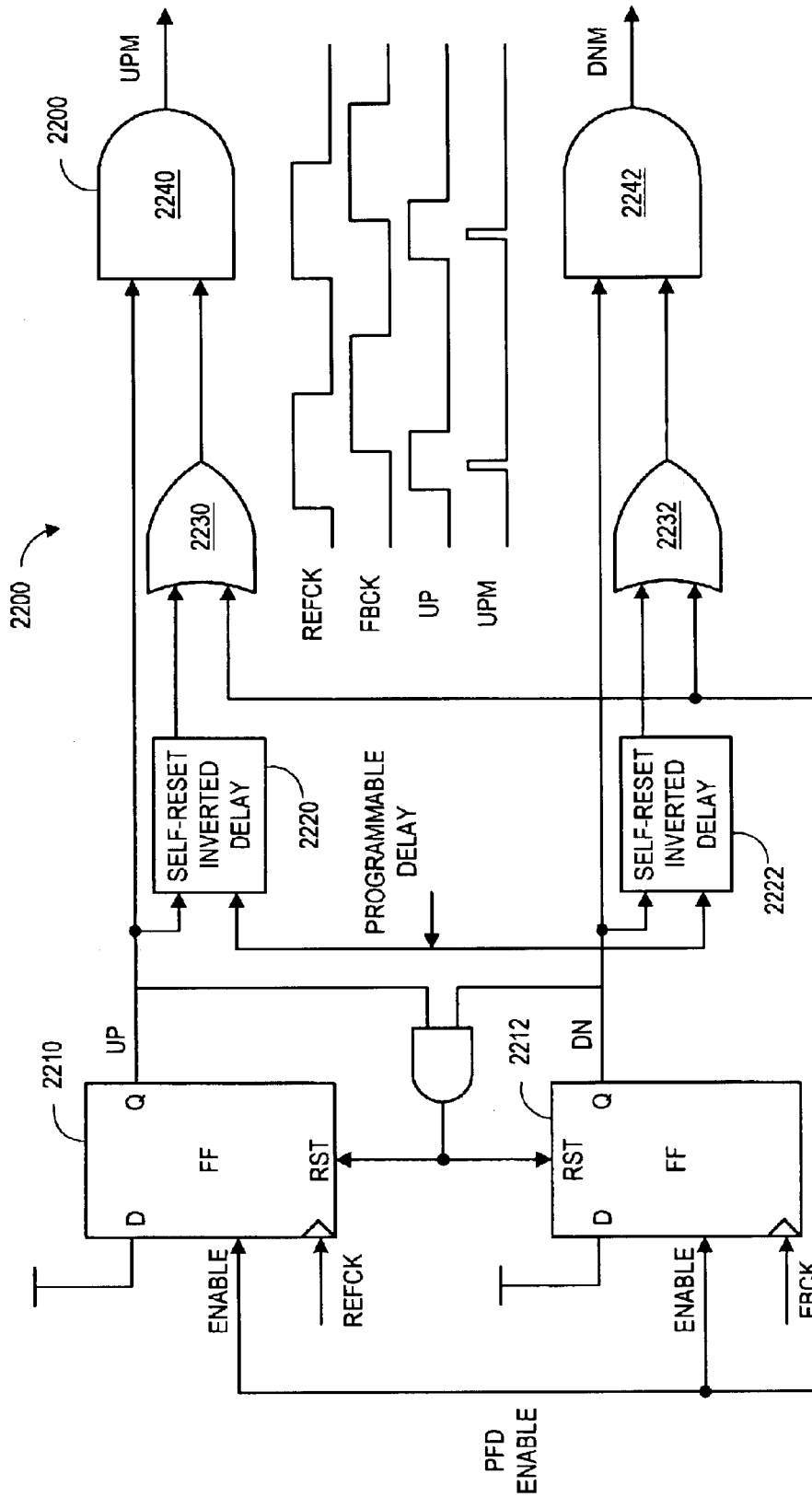
FIG. 22 is a block diagram of an enabled phase frequency detector circuit according to some embodiments.

FIG. 22 is a block diagram of an enabled phase frequency detector circuit 2200 according to some embodiments. The circuit 2200 may be associated with the PFD and chop control unit 2130 described with respect to FIG. 21 and may incorporate, for example, a Self Reset Delay (SRD) chop circuit and override function.

In particular, a first flip flop 2210 receives a PFD ENABLE signal (e.g., from the PFD and CP enable state machine 2120) along with the reference clock signal (REFCK). An UP signal from the first flip flop 2210 is provided to a self-reset inverted delay 2220 along with programmable delay information The output of the self-reset inverted delay 2220 is provided to an OR gate 2230 along with the PFD ENABLE signal (e.g., as chop override). The output of the OR gate 2230 is provided to an AND gate 2240 along with the UP signal to generate UPM.

Similarly, a second flip flop 2212 receives the PFD ENABLE signal along with the feedback clock signal (FBCK). A DN signal from the first flip flop 2212 is provided to a second self-reset inverted delay 2222 along with programmable delay information. The output of this self-reset inverted delay 2222 is provided to a second OR gate 2232 along with the PFD ENABLE signal (e.g., as chop override). The output of this OR gate 2232 is provided to a second AND gate 2240 along with the DN signal to generate DNM. Note that the UP and DN signals are combined via an AND gate and the result is used to reset both flip flops 2210, 2212.

Thus, the circuit 2200 may limit the UP/DN width signal that in turn limits the charge pump 2150 charge/discharge transfer. In this way, the magnitude of the VCO 2180 control voltage change may be small for a short voltage droop where phase error has accumulated. According to this embodiment, the SRD is programmable (e.g., it may be set to the maximum delay before lock is achieved). Note that the SRD may ignore large jitter on the reference clock signal that is also presented to the PLL as a large phase error.

The PFD ENABLE signal may be de-asserted in response to a voltage droop, allowing the PLL to only sample the residual phase error after the voltage droop ends (enhancing stability). Note that both the chop and the PFD may be enabled before lock is achieved to prevent any lock time compromise.

Figure 23:
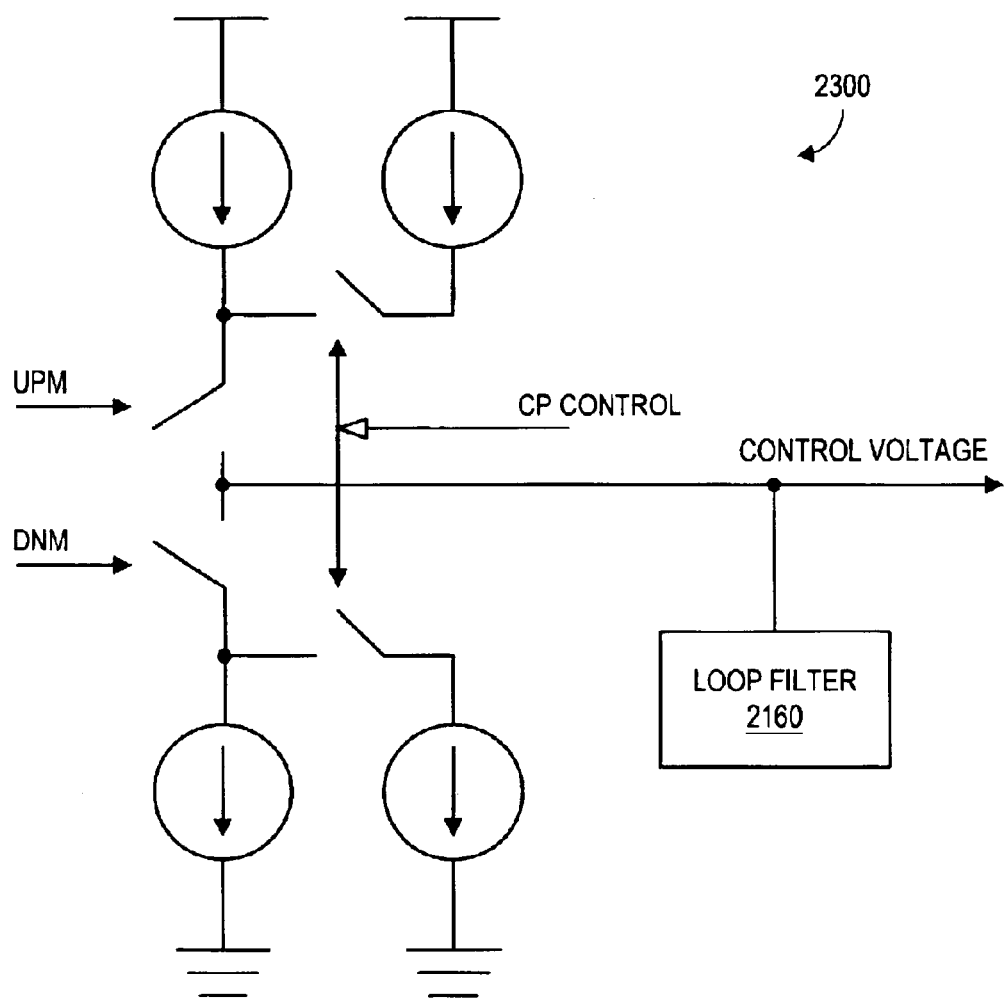
FIG. 23 is a block diagram of a charge pump strength control circuit according to some embodiments.

FIG. 23 is a block diagram of a charge pump strength control circuit 2300 according to some embodiments. The circuit 2300 may be associated with, for example, the charge pump 2150 described with respect to FIG. 21.

The UPM and DNM signals are received from the PFD and chop control unit 2130. An enabled current source and sink may be associated with an adjustment to the strength of the charge pump 2150. After lock, the CP CONTROL SIGNAL (i.e., received from the PFD & CP enable state machine 2120) is asserted to decrease the amount of charge/discharge of the loop filter 2160 capacitor. As a result, the change in CONTROL VOLTAGE that is provided to the bias unit 2170 may be limited.

Figure 24:
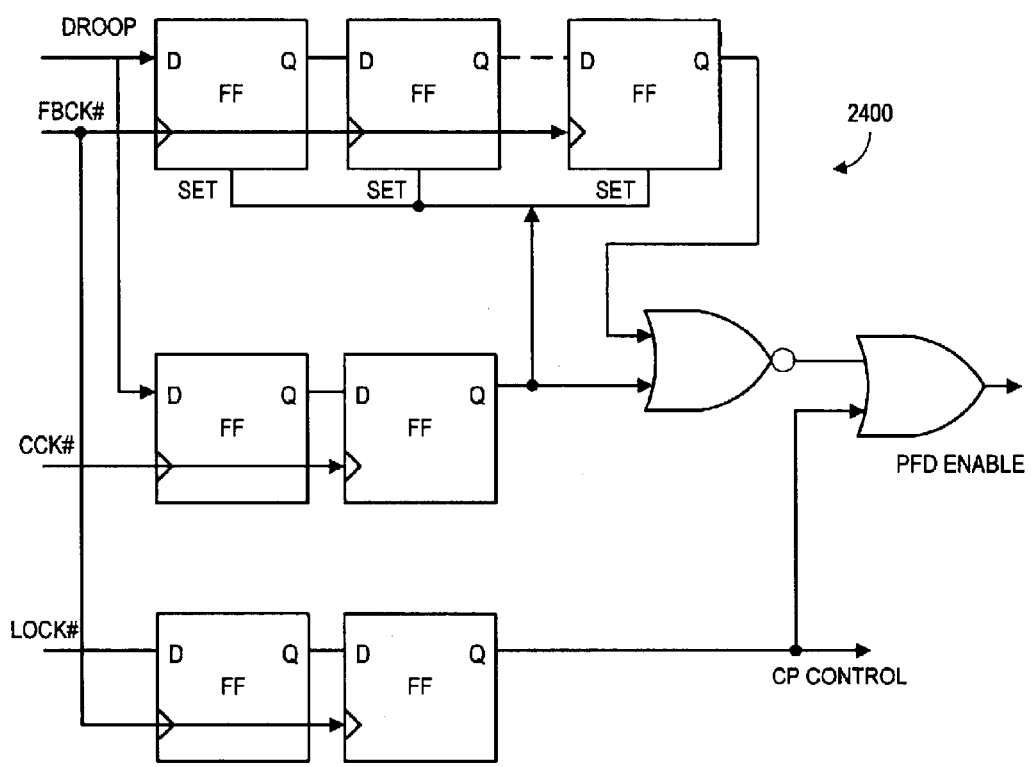
FIG. 24 is a block diagram of a phase frequency detector and charge pump control state machine circuit according to some embodiments.

FIG. 24 is a block diagram of a PFD and CP enable state machine circuit 2400 according to some embodiments. The circuit 2400 may be associated with, for example, the PFD and CP enable state machine 2120 described with respect to FIG. 21.

The circuit 2400 synchronizes the asynchronous output of the droop detector 2110 using a number of flip flops (e.g., master-slave flip flops). In particular, DROOP is synchronized using CCK# (associated with the core clock), which may be aligned with the system clock every n clocks. The synchronization may reduce glitches or meta-stability problems at the PFD. Moreover, the circuit 2400 may quickly disable the PFD before a significant phase error is accumulated (e.g., by controlling the PFD ENABLE signal that is sent to the PFD and chop control unit 2130). The de-assertion of the voltage droop signal is synchronized with FBCK# (note that PFD sampling occurs at the rising edge of FBCK). The de-assertion is delayed for m number of BCLK (s) until the voltage droop is no longer present. As a result, the PFD may be associated with residual phase error. Similarly, the LOCK# is synchronized with FBCK# before CP CONTROL is sent to the charge pump 2150 to decrease its strength.

Figure 25:
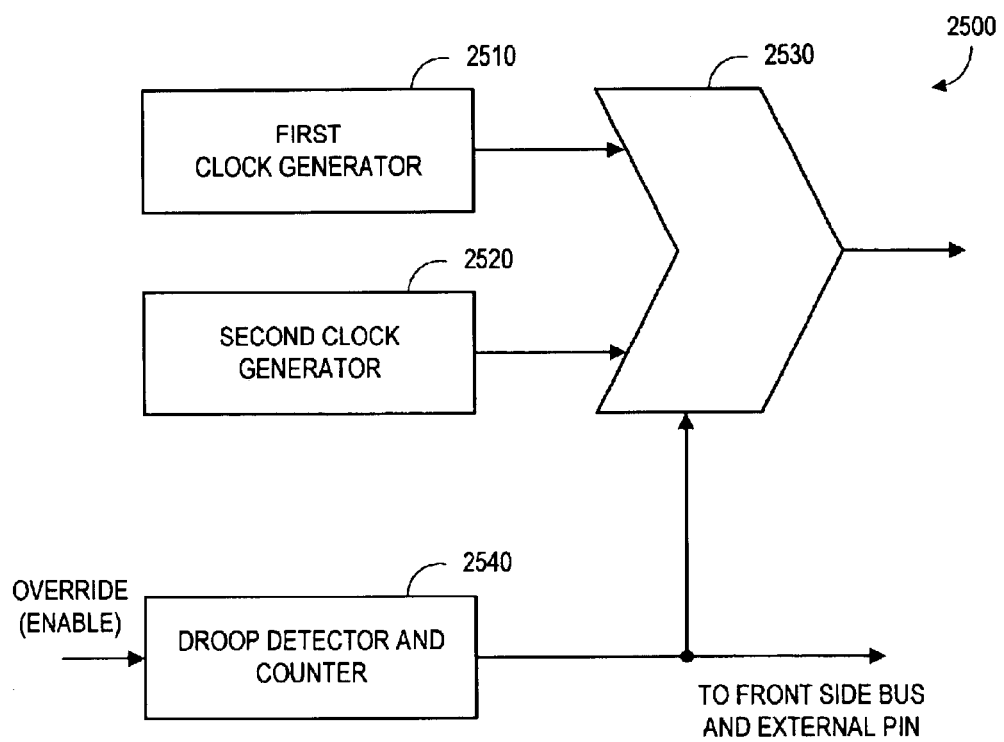
FIG. 25 illustrates an adaptive frequency clock signal architecture according to another embodiment.

FIG. 25 illustrates an adaptive frequency clock signal architecture 2500 according to another embodiment. In this case, a first clock generator 2510 and a second clock generator 2520 are always running, and both lock to a single system clock. The first clock generator 2510 is a $V_{CC}$ tracking PLL unit 1910 while the second clock generator 2520 is on a fixed power supply. The frequency of the second clock generator 2520 is fixed and is set lower than the frequency of the first clock generator 2510. According to this embodiment, a selector 2530 normally injects the first clock into the core clock distribution tree.

A droop detector and counter 2540 is adapted to detect a voltage droop (e.g., when $V_{CC}$ is less than a threshold voltage). If the voltage droop lasts a pre-determined period of time (e.g., a pre-determined number of cycles as tracked by the counter), the selector 2530 receives an indication from the droop detector and counter 2540 causing the second clock to be injected into the core clock distribution tree. Similarly, if the voltage droop is no longer present for a pre-determined period of time, the selector 2530 again injects the first clock into the core clock distribution tree. Such an approach may let the core clock remain synchronous with the system clock during longer voltage droops.

According to some embodiments, a signal is sent to the bus unit and/or the external system (e.g., via an external pin of the processor) prior to switching the clock signal. This may help ensure, for example, a proper interface with the system. Moreover, a wait cycle may be used when switching between the clocks (e.g., to reduce the likelihood of a glitch).

Integrated Circuit

Figure 26:
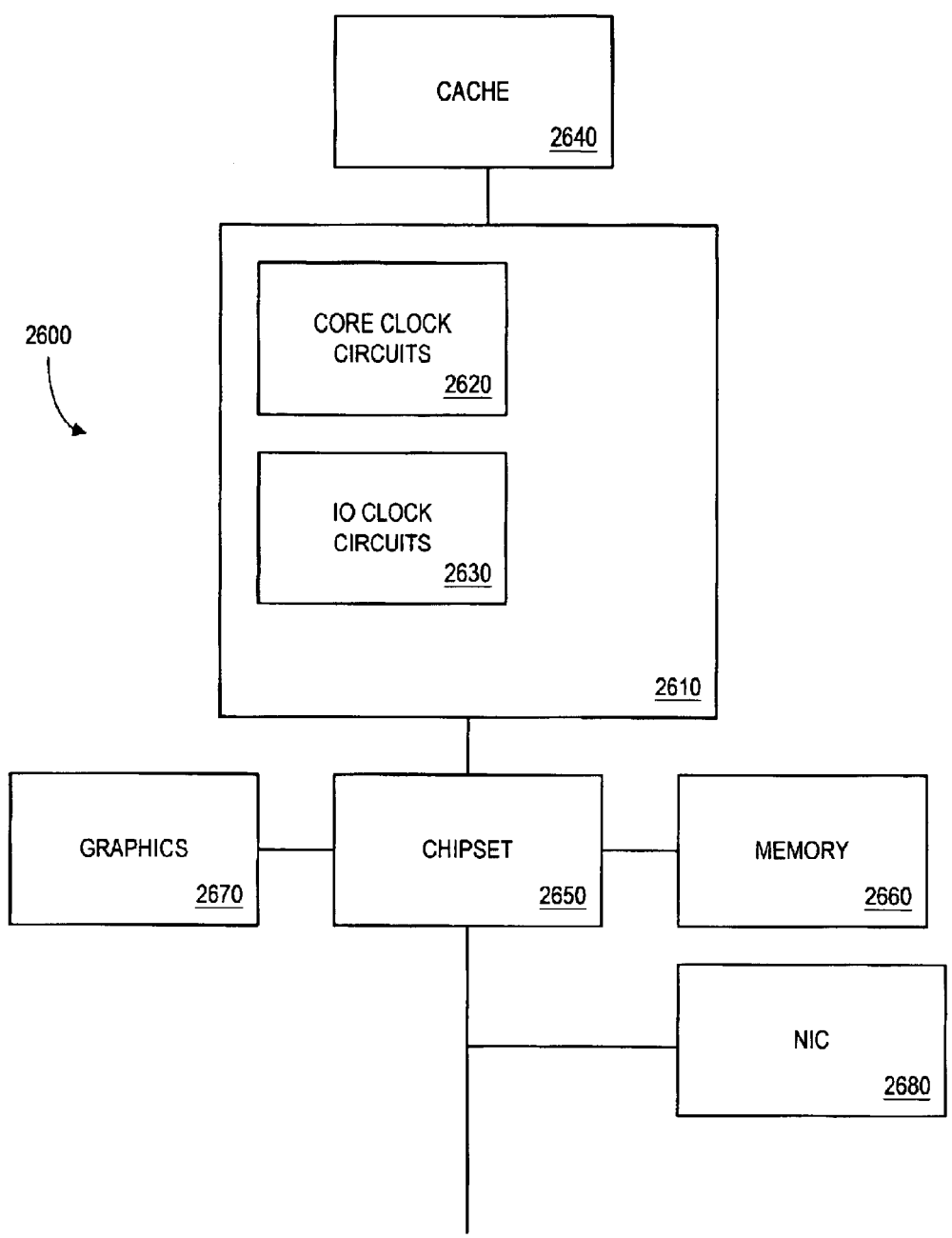
FIG. 26 is a block diagram of a system that includes an integrated circuit according to some embodiments.

FIG. 26 is a block diagram of a system 2600 that includes an integrated circuit 2610 with core clock circuitry 2620 and IO clock circuitry 2630. The core clock circuitry 2620 and/or IO clock circuitry 2630 may incorporate any of the adaptive frequency embodiments described herein (e.g., discrete or analog adaptive frequency systems). Moreover the integrated circuit 2610 may be a processor or another type of integrated circuit. According to some embodiments, the integrated circuit 2610 also communicates with an off-die cache 2640. The integrated circuit 2610 may also communicate with a system memory 2660 via a host bus and a chipset 2650. In addition, other off-die functional units, such as a graphics accelerator 2670 and a Network Interface Controller (NIC) 2680 may communicate with the integrated circuit 2610 via appropriate busses.

Thus, some embodiments may generate and distribute a clock signal having a frequency that is adjusted based on a condition associated with a processor die. As a result, the design and manufacture of low power and/or low cost systems may be facilitated.

The several embodiments described herein are solely for the purpose of illustration. Persons skilled in the art will recognize from this description other embodiments may be practiced with modifications and alterations limited only by the claims.

What is claimed is:

1. A circuit, comprising:
   a clock signal input line to receive an input clock signal;
   a plurality of bimodal delay elements forming a delay chain to generate an output clock signal; and
   a clock signal output line to provide the output clock signal having an adjusted frequency that is based on a condition associated with a die.

2. The circuit of claim 1, wherein the output clock signal is synchronized with the input clock signal.

3. The circuit of claim 1, wherein the output clock signal has a default frequency when the condition is not present and the adjusted frequency when the condition is present.

4. The circuit of claim 3, wherein the adjusted frequency is one of a plurality of discrete values.

5. The circuit of claim 1, further comprising:
   a phase-locked loop unit coupled to the clock signal input line.

6. The circuit of claim 5, further comprising:
   a plurality of core state elements coupled to the clock signal output line via a core clock network.

7. The circuit of claim 1, further comprising:
   a detector to detect the condition.

8. The circuit of claim 7, wherein the detector comprises at least one of: (i) a voltage droop detector, and (ii) a thermal detector.

9. The circuit of claim 7, wherein the detector determines a level associated with the condition in accordance with a plurality of pre-determined threshold values.

10. The circuit of claim 1, wherein the adjusted frequency comprises one of a plurality of reduced values or at least one compensating value.

11. A circuit, comprising:
    a clock signal input line to receive an input clock signal;
    a delay-locked loop unit coupled to the clock signal input line and adapted to generate a plurality of offset clock signals; and
    a clock signal output line to provide an output clock signal having an adjusted frequency that is based on a condition associated with a die.

12. The circuit of claim 11, further comprising:
    a multiplexer to receive the plurality of offset clock signals.

13. The circuit of claim 12, further comprising:
    a select state machine coupled to the multiplexer and adapted to select one of the offset clock signals to create the output clock signal.

14. The circuit of claim 13, further comprising:
    a detector to provide a condition detect signal to the select state machine, wherein the select state machine selects one of the offset clock signals in accordance with the condition detect signal.

15. The circuit of claim 14, further comprising:
    a meta-stable immune interface between the detector and the select state machine, wherein the meta-stable immune interface is to facilitate generation of the output clock signal at the adjusted frequency until an asynchronous condition signal becomes synchronized.

16. The circuit of claim 14, further comprising:
    a mode select state machine coupled to the detector and the select state machine.

17. The circuit of claim 16, wherein the mode select state machine comprises:
   a counter.

18. The circuit of claim 17, wherein the output clock signal has a default frequency higher than the adjusted frequency, and the counter is to arrange for the output clock signal to have another frequency higher than the default frequency when the condition is no longer present.

19. The circuit of claim 12, further comprising:
   a delay chain coupled between the multiplexer and the clock signal output line.

20. The circuit of claim 12, further comprising:
   a clock scrambler coupled between the delay-locked loop unit and the multiplexer, wherein the clock scrambler is to arrange the offset clock signals in an order associated with the adjusted frequency.

21. The circuit of claim 11, wherein the delay-locked loop unit is to generate: (i) a first set of offset clock signals based on the input clock signal, and (ii) the plurality of offset clock signals are generated based on an interpolation of the first set of offset clock signals.

22. The circuit of claim 21, wherein the interpolation is performed via at least one of: (i) buffer sizing, and (ii) tap shorting.

23. The circuit of claim 11, wherein the delay-locked loop unit comprises:
   a phase detector coupled to the clock signal input line;
   a charge pump coupled to the phase detector;
   a capacitor coupled between the charge pump and a ground;
   a bias unit coupled to the charge pump;
   a delay chain coupled to the bias circuitry, the clock signal input line, and the phase detector; and
   a clock interpolator.

24. A circuit, comprising:
   a clock signal input line to receive a reference clock signal;
   a clock signal output line to provide an output clock signal having an adjusted frequency that is based on a condition associated with a die; and
   a core voltage tracking phase-locked loop unit coupled to the clock signal input line and the clock signal output line, wherein the frequency of the output clock signal is adjusted in an analog fashion.

25. The circuit of claim 24, further comprising:
   a digital power supply to provide power to the core voltage tracking phase-locked loop unit.

26. The circuit of claim 25, wherein the core voltage tracking phase-locked loop unit further comprises a high frequency filter.

27. The circuit of claim 26, further comprising a charge pump having an adjustable strength.

28. The circuit of claim 24, wherein a phase frequency detect signal is disabled during a voltage droop and is held for a at least one cycle after the voltage droop is no longer present.

29. A method, comprising:
   determining a condition associated with a die;
   generating a plurality of offset clock signals;
   selecting edges from the plurality of offset clock signals to generate a clock signal with an adjusted frequency; and
   adjusting the frequency of the clock signal based on the determined condition.

30. The method of claim 29, wherein the condition is associated with a voltage provided to state elements.

31. The method of claim 29, wherein the condition is associated with a temperature of the die.

32. The method of claim 29, wherein said determining comprises determining a level associated with the condition and the frequency is adjusted based on the level.

33. The method of claim 29, wherein the clock signal originally had a default frequency, said adjusting comprises adjusting the frequency to an adjusted frequency, and further comprising:
   determining that the condition is no longer present; and
   adjusting the frequency to a compensating frequency.

34. The method of claim 29, wherein the adjusted frequency is lower than the default frequency and the compensating frequency is higher than the default frequency.

35. The method of claim 34, wherein the difference between the default and adjusted frequencies is greater than the difference between the default and compensating frequencies.

36. The method of claim 34, wherein the clock frequency remains at the compensating frequency longer than it remained at the adjusted frequency.

37. The method of claim 36, further comprising:
   adjusting the frequency back to the default frequency.

38. The method of claim 29, wherein the frequency is adjusted to one of a plurality of discrete frequencies.

39. The method of claim 38, wherein the frequency is adjusted via a delay chain.

40. A method, comprising:
   determining a condition associated with a die; and
   adjusting a frequency of a clock signal based on the determined condition, wherein the frequency is adjusted via a delay-locked loop unit and a state machine.

41. A method, comprising:
   determining a condition associated with a die; and
   adjusting a frequency of a clock signal in an analog fashion based on the determined condition, wherein the frequency is adjusted by a core voltage tracking phase-locked loon unit.

42. The method of claim 41, wherein a digital power supply provides power to the core voltage tracking phase-locked loop unit.

43. The method of claim 42, wherein the core voltage tracking phase-locked loop unit includes a high frequency filter.

44. A processor, comprising:
   a core portion adapted to generate a core clock signal having an adjusted frequency that is based on a condition associated with a die;
   an input output portion adapted to generate an input output clock signal having a fixed frequency; and
   a first-in, first-out storage structure between the core portion and the input output portion.

45. The processor of claim 44, wherein the adjusted frequency is one of a plurality of discrete values.

46. The processor of claim 44, wherein the frequency is adjusted in an analog fashion.

47. A system, comprising:
   a chipset; and
   a die comprising a microprocessor in communication with the chipset, wherein the microprocessor includes an adaptive frequency system comprising:
      a clock signal input line to receive an input clock signal;

a plurality of bimodal delay elements forming a delay chain to generate an output clock signal; and a clock signal output line to provide the output clock signal having an adjusted frequency that is based on a condition associated with a die.

48. The system of claim 47, wherein the adjusted frequency is one of a plurality of discrete values.

49. A circuit, comprising:

a clock signal input line to receive an input clock signal;

a clock signal output line to provide an output clock signal having an adjusted frequency that is based on a condition associated with a die;

a plurality of core state elements coupled to the output clock signal output line; and a first-in, first-out storage structure to exchange information with at least some of the core state elements.

50. The circuit of claim 49, wherein the first-in, first-out storage structure comprises a circular buffer circuit including a multiplexer.

51. The circuit of claim 49, wherein the first-in, first-out storage structure is also to exchange information with at least some of a plurality of input output state elements.

52. A circuit, comprising:

a clock signal input line to receive an input clock signal;

a phase-locked loop unit coupled to the clock signal input line; and a clock signal output line to provide an output clock signal having an adjusted frequency that is based on a condition associated with a die; and a matched core clock network coupled to: (i) the phase-locked loop unit via a divider, and (ii) the clock signal input line.

* * * * *